US005326997A

United States Patent [19]
Nakanishi

[11] Patent Number: 5,326,997
[45] Date of Patent: Jul. 5, 1994

[54] LINEAR IMAGE SENSOR WITH SHUTTER GATES FOR DRAINING EXCESS CHARGE

[75] Inventor: Junji Nakanishi, Itami, Japan

[73] Assignee: Mitsubishi Denki Kabushiki Kaisha, Tokyo, Japan

[21] Appl. No.: 984,083

[22] Filed: Dec. 1, 1992

[30] Foreign Application Priority Data

Jun. 18, 1992 [JP] Japan .................. 4-186218

[51] Int. Cl.$^5$ ............... H01L 29/78; H01L 27/14; H01L 31/00
[52] U.S. Cl. ................... 257/230; 257/223; 257/233; 257/234; 257/236; 348/299; 348/314
[58] Field of Search ............. 257/223, 230, 233, 234, 257/236; 358/213.19, 213.25, 213.28, 213.29, 213.31

[56] References Cited

U.S. PATENT DOCUMENTS

| | | | |
|---|---|---|---|
| 4,604,652 | 8/1986 | Elabd et al. | 257/243 |
| 4,800,435 | 1/1989 | Ikeda et al. | 358/213.19 |
| 4,837,628 | 6/1989 | Sasaki | 358/209 |
| 4,908,709 | 3/1990 | Ihuiya et al. | 358/213.19 |
| 5,055,900 | 10/1991 | Fossum et al. | 257/243 |
| 5,181,101 | 1/1993 | Oda | 358/43 |

FOREIGN PATENT DOCUMENTS

| | | |
|---|---|---|
| 60-120555 | 6/1985 | Japan . |
| 61-17387 | 5/1986 | Japan . |
| 61-94466 | 5/1986 | Japan . |
| 62-200761 | 9/1987 | Japan . |

Primary Examiner—Ngan Ngo
Attorney, Agent, or Firm—Leydig Voit & Mayer

[57] ABSTRACT

In a linear sensor, a charge transfer part is disposed between a one-dimensional array of photodetectors and an overflow drain and includes a CCD having four or more transfer gates for each photodetector for transferring signal charges from the photodetector array in a direction of the photodetector array, transfer gates controlling charge transfer from the photodetectors to the CCD, and shutter gates for controlling charge transfer from the charge transfer part to the overflow drain. Each transfer gate is disposed between each photodetector and a prescribed one of the four or more transfer gates, and each shutter gate is disposed between the prescribed transfer gate and the overflow drain. The four or more CCD transfer gates are controlled by four or more phase driving clocks. Therefore, during charge transfer, at least three adjacent CCD transfer gates are all closed so that signal charges are drained from the photodetector into the overflow drain through the transfer gate in the middle of the three transfer gates without mixing the drained signal charges with the signal charges transferred. The charge drain operation is carried out during the charge transfer operation in the charge transfer part whereby the timing of opening the shutter gate can be set at an arbitrary time in the charge read cycle.

6 Claims, 26 Drawing Sheets

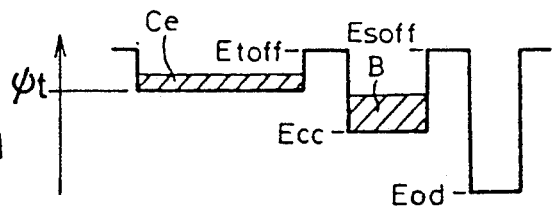
FIG.3(a) tn0 < t < tn1
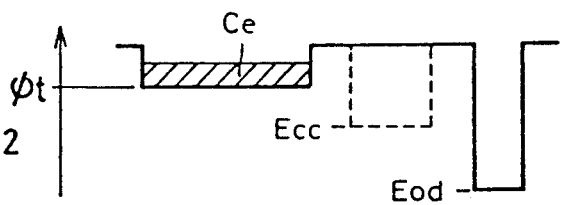
FIG.3(b) tn3 ≦ t < Tc2
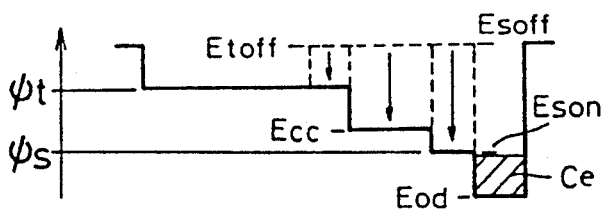
FIG.3(c) t = Tc2
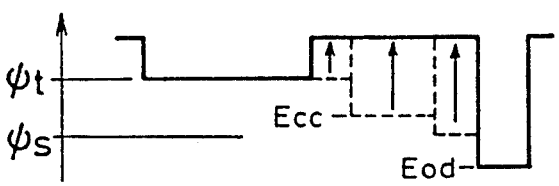
FIG.3(d) t = Tc3
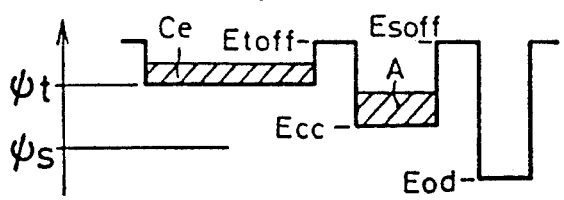
FIG.3(e) t = tn7
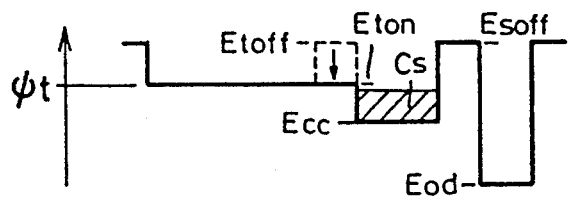
FIG.3(f) t = Ta4 (t = Ta0)
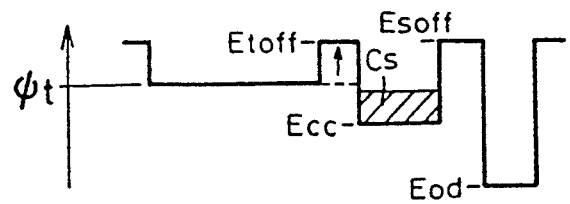
FIG.3(g) t = Ta5 (t = Ta1)

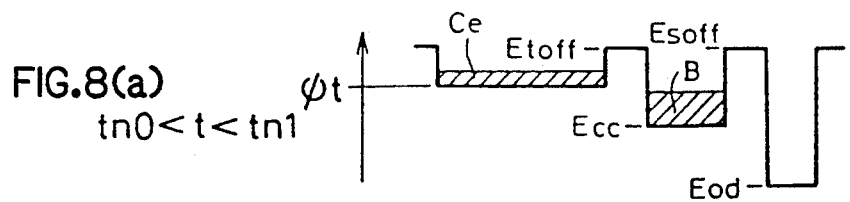
FIG.8(a) tn0 < t < tn1
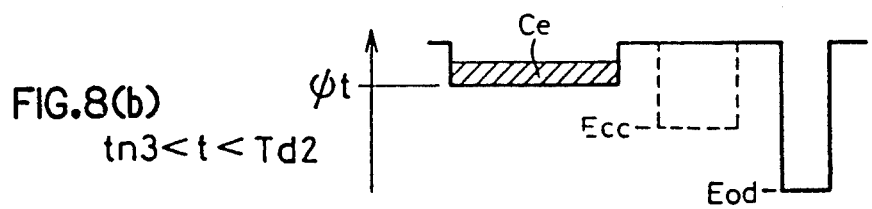
FIG.8(b) tn3 < t < Td2
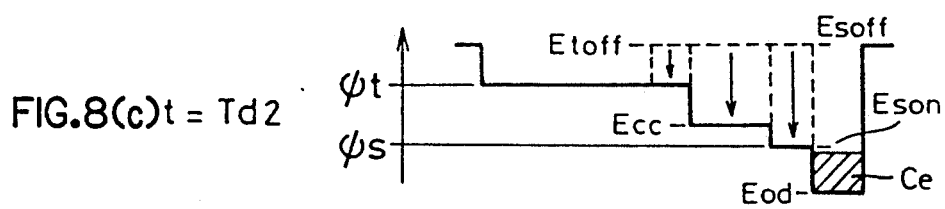
FIG.8(c) t = Td2
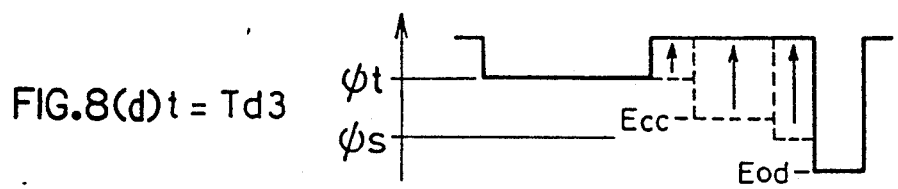
FIG.8(d) t = Td3
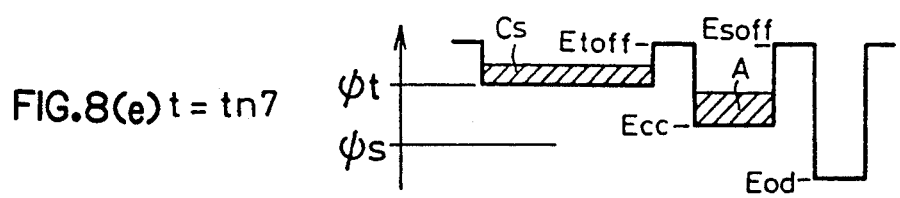
FIG.8(e) t = tn7
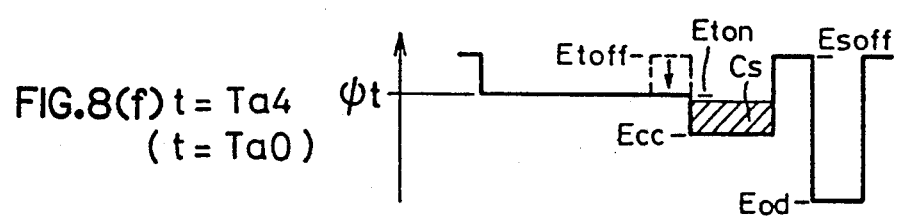
FIG.8(f) t = Ta4 (t = Ta0)
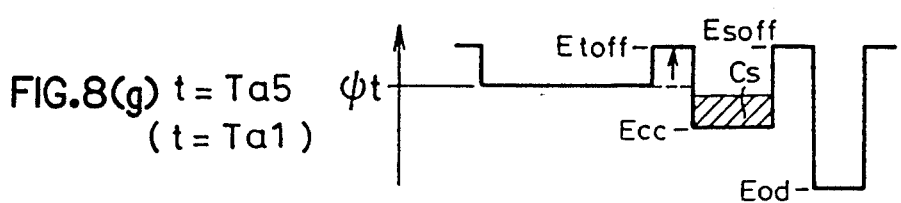
FIG.8(g) t = Ta5 (t = Ta1)

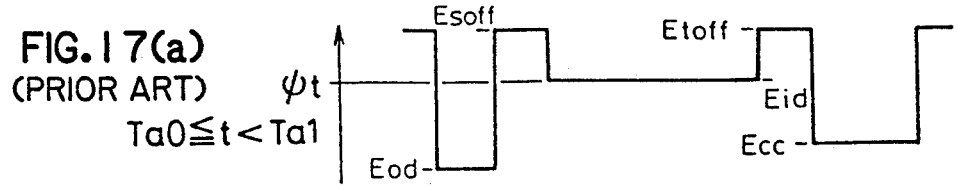
FIG. 17(a) (PRIOR ART) $\psi t$ $Ta0 \leq t < Ta1$
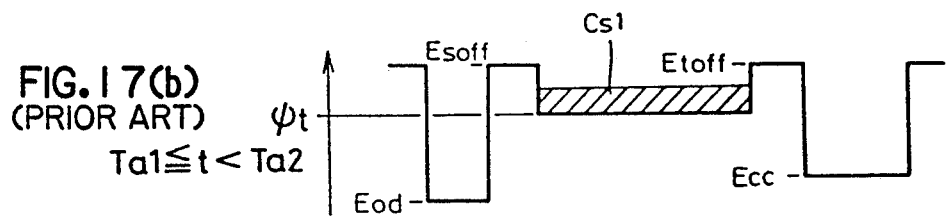
FIG. 17(b) (PRIOR ART) $\psi t$ $Ta1 \leq t < Ta2$
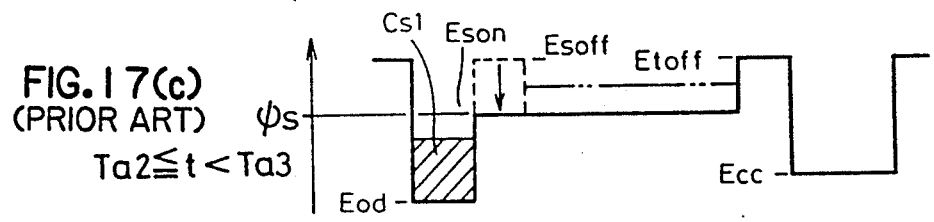
FIG. 17(c) (PRIOR ART) $\psi s$ $Ta2 \leq t < Ta3$
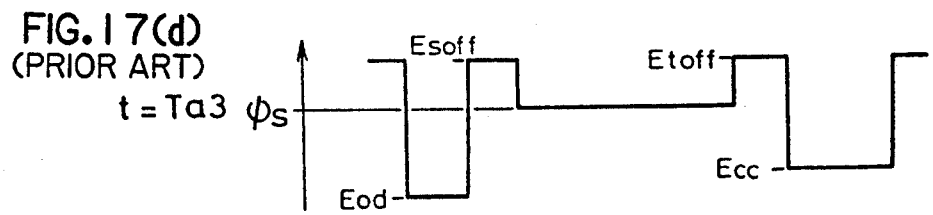
FIG. 17(d) (PRIOR ART) $t = Ta3$ $\psi s$
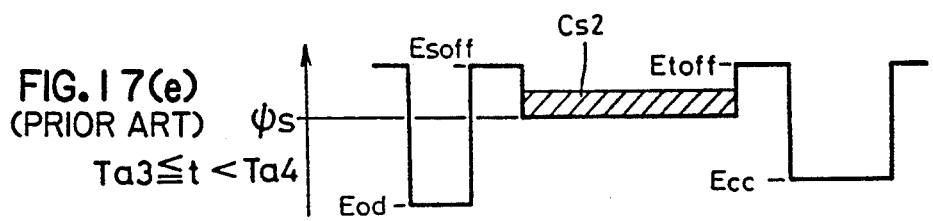
FIG. 17(e) (PRIOR ART) $\psi s$ $Ta3 \leq t < Ta4$
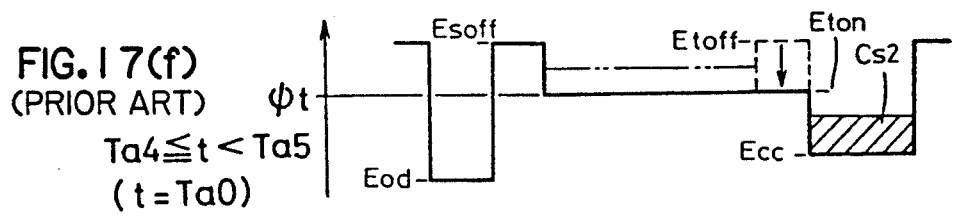
FIG. 17(f) (PRIOR ART) $\psi t$ $Ta4 \leq t < Ta5$ ($t = Ta0$)

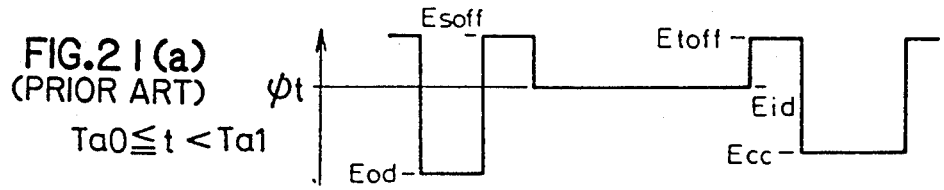
FIG.21(a) (PRIOR ART) $Ta0 \leq t < Ta1$
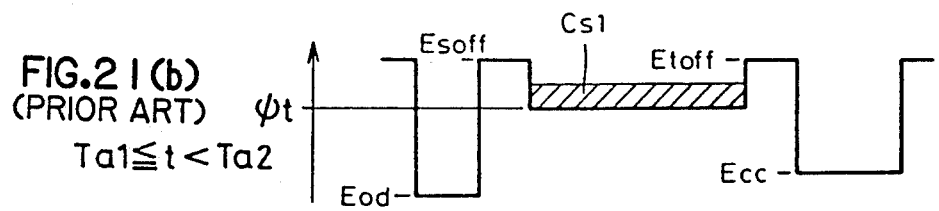
FIG.21(b) (PRIOR ART) $Ta1 \leq t < Ta2$
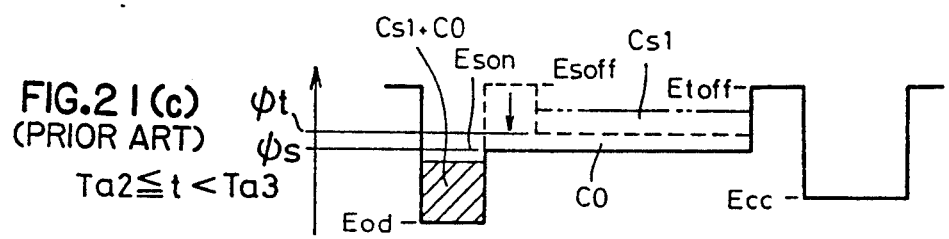
FIG.21(c) (PRIOR ART) $Ta2 \leq t < Ta3$
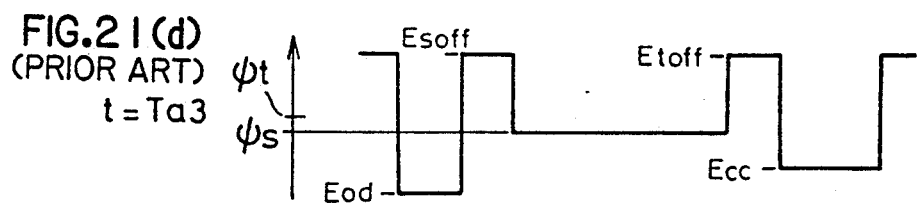
FIG.21(d) (PRIOR ART) $t = Ta3$
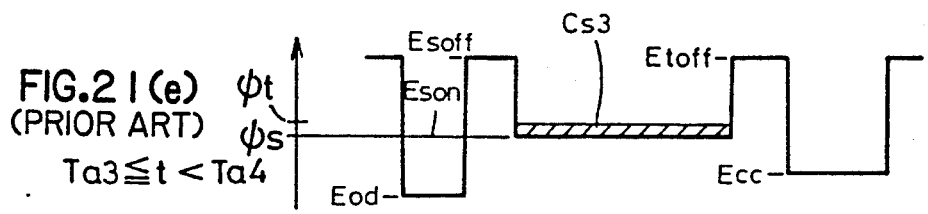
FIG.21(e) (PRIOR ART) $Ta3 \leq t < Ta4$
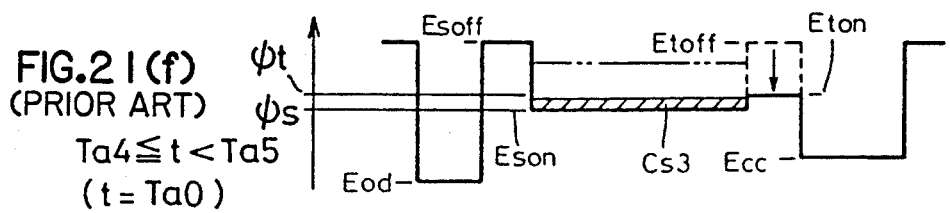
FIG.21(f) (PRIOR ART) $Ta4 \leq t < Ta5$ ($t = Ta0$)

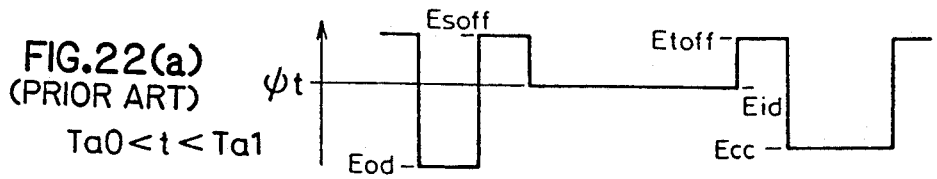
FIG.22(a) (PRIOR ART) Ta0 < t < Ta1
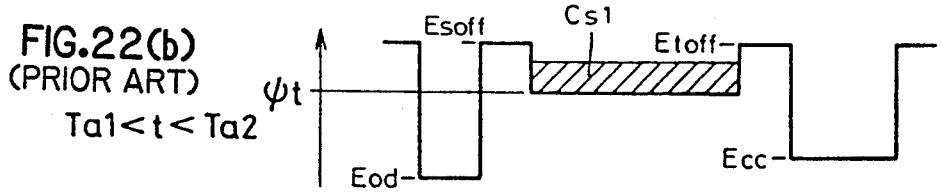
FIG.22(b) (PRIOR ART) Ta1 < t < Ta2
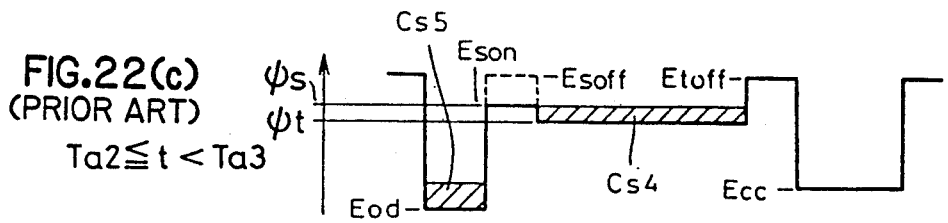
FIG.22(c) (PRIOR ART) Ta2 ≦ t < Ta3
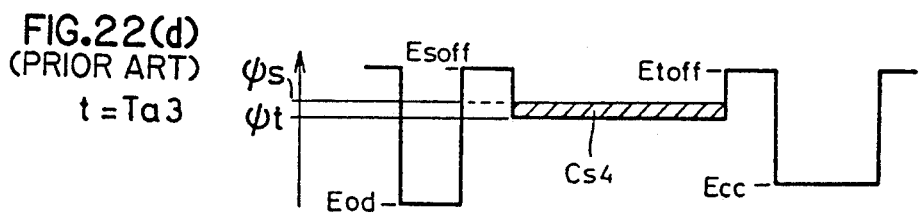
FIG.22(d) (PRIOR ART) t = Ta3
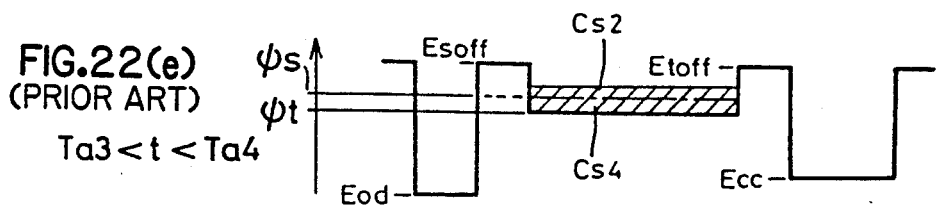
FIG.22(e) (PRIOR ART) Ta3 < t < Ta4
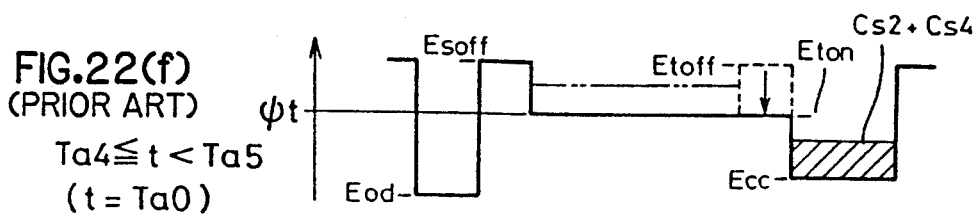
FIG.22(f) (PRIOR ART) Ta4 ≦ t < Ta5 (t = Ta0)

FIG.25(a) (PRIOR ART) $Ta1 < t < Tb2$
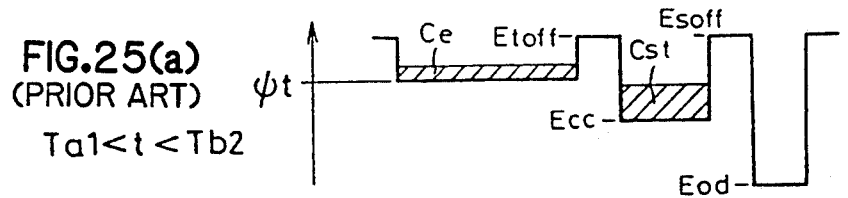
FIG.25(b) (PRIOR ART) $Tb2 \leq t < Tb3$
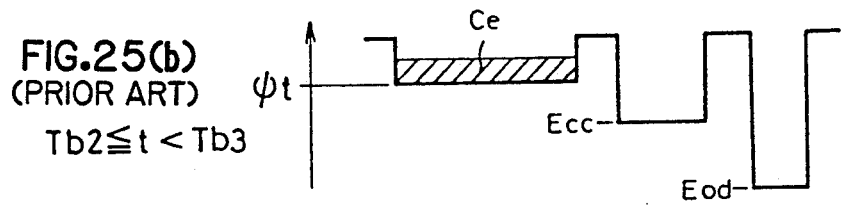
FIG.25(c) (PRIOR ART) $Tb3 \leq t < Tb4$
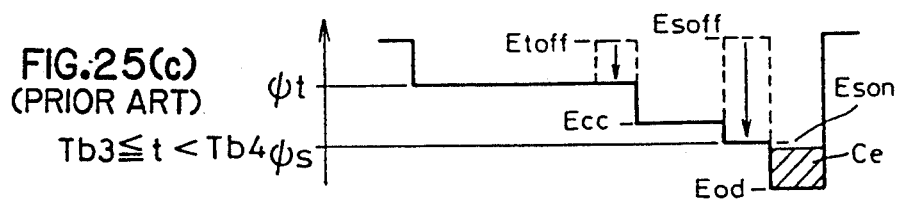
FIG.25(d) (PRIOR ART) $t = Tb4$
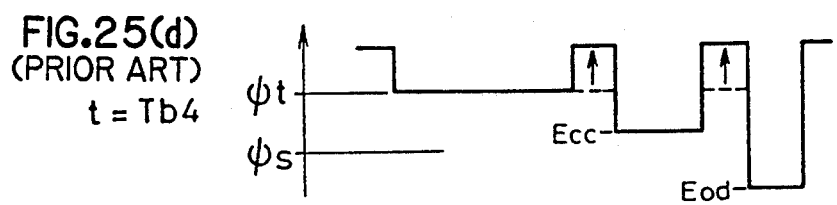
FIG.25(e) (PRIOR ART) $Tb4 < t < Tb5$
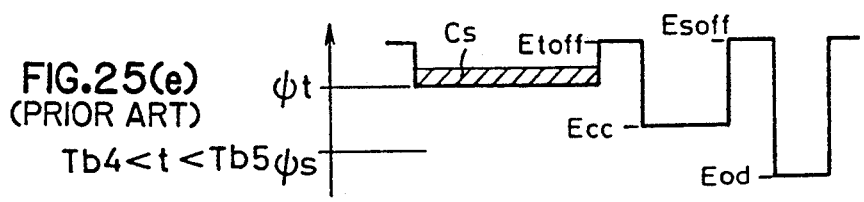
FIG.25(f) (PRIOR ART) $Tb5 \leq t < Tb6$ ($t = Ta0$)
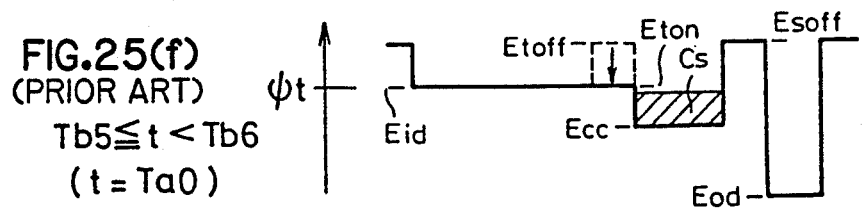
FIG.25(g) (PRIOR ART) $t = Tb6$ ($t = Ta1$)
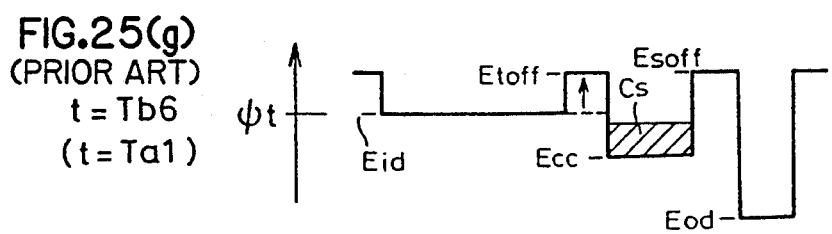

LINEAR IMAGE SENSOR WITH SHUTTER GATES FOR DRAINING EXCESS CHARGE

FIELD OF THE INVENTION

The present invention relates to a linear image sensor with an electron shutter mechanism and a method for driving the linear image sensor.

BACKGROUND OF THE INVENTION

With the progress in silicon LSI technology in recent years, a linear image sensor, in which a one-dimensional array of photodetectors and a charge coupled device (hereinafter referred to as CCD) transferring signal charges generated in the photodetectors are combined on a semiconductor substrate, has been put to practical use. Photodiodes utilizing p-n junction or Schottky barrier diodes are used as the photodetectors. The linear image sensor is called a visible image sensor or an infrared image sensor, depending on a wavelength detected by the image sensor. Some of these image sensors are provided with an electron shutter mechanism for preventing saturation of signal charges in the photodetectors.

FIGS. 15(a) and 15(b) illustrate a prior art infrared linear image sensor with such an electron shutter mechanism, in which FIG. 15(a) is a plan view schematically showing a layout of elements constituting the sensor and FIG. 15(b) is a sectional view taken along a line XVb—XVb of FIG. 15(a).

In FIG. 15(a), an infrared linear image sensor 200 includes a p type silicon substrate 9, a one-dimensional array of infrared detectors 1, a CCD 12, and an overflow drain 13. The CCD 12 and the over-flow drain 13 are parallel to each other with the array of the infrared detectors 1 between. Each infrared detector 1 is connected to the CCD 12 through a transfer gate 4 which controls transfer of charges from the infrared detector 1 to the CCD 12. In addition, each infrared detector 1 is connected to the overflow drain 13 through a shutter gate 15 which controls transfer of charges from the infrared detector 1 to the overflow drain 13. Gates of transistors constituting the transfer gates 4 and the shutter gates 15 are connected to input terminals It and Is, respectively, and controlled by clock signals from the input terminals It and Is.

In this structure, the CCD 12 constitutes a charge transfer circuit which transfers signal charges generated in the infrared detectors 1 in a direction of the array of infrared detectors, and an output amplifier 8 is connected to an output end of the charge transfer circuit. The overflow drain 13 is biased with positive external voltage and signal charges generated in the detectors 1 are drawn into the overflow drain 13.

A description is given of a sectional structure of the linear image sensor 200 with reference to FIG. 15(b). In FIG. 15(b), reference numeral 10 designates a PtSi/Si Schottky barrier diode as the above-described infrared detector 1, which comprises a platinum silicide layer 1a selectively disposed on the p type silicon substrate 9 and a p type silicon region 9a contacting the platinum silicide layer 1a to produce a Schottky junction. In addition, a guard ring 11 is disposed around the p type silicon region 9a, so that leakage current from the infrared detector 1 is reduced. The guard ring 11 and the platinum silicide layer 1a serve as a charge storage region of the infrared detector 1.

An n type impurity diffused region 12d as a CCD channel and an n type impurity diffused region as the overflow drain 13 are disposed at opposite sides of the p type silicon region 9a of the infrared detector 1 with prescribed intervals from the p type silicon region 9a. In addition, a CCD transfer gate 12a comprising polysilicon is disposed on the n type impurity region 12d through a gate insulating film 10a. The CCD transfer gate 12a is connected to an input terminal Ic through which a transfer clock signal is supplied to the CCD 12.

A p type impurity region 4b having a prescribed concentration is disposed between the guard ring 11 and the CCD channel 12d and a p type impurity region 15b having a prescribed concentration is disposed between the guard ring 11 and the n type impurity region of the overflow drain 13. Gate electrodes 4a and 15a comprising polysilicon are disposed on the p type impurity region 4b and the p type impurity region 15b, respectively, through gate insulating films 10a. Thus, transistors as the transfer gate 4 and the shutter gate 15 are constituted. Characteristics of the transistors, i.e., potential levels in their ON and OFF states, are varied by varying the concentrations of the n type impurity regions 4b and 15b. Therefore, the concentrations are set so that the potential levels of the transistors as the transfer gate and the shutter gate are equal to each other.

FIG. 16 is a schematic diagram for explaining operation of the transfer gate and the shutter gate in a charge read cycle Xr of the image sensor of FIGS. 15(a) and 15(b). FIGS. 17(a)-17(f) are schematic diagrams illustrating potential profiles during the charge read operation in a cross-section taken along a line XVb-XVb of FIG. 15(a). The charge read operation will be described using FIGS. 16 and 17(a)-17(f).

When a driving clock CLt of the transfer gate 4 rises at time Ta0, the transfer gate 4 opens, that is, the potential level of the transfer gate 4 falls to an ON level $Et_{on}$ from an OFF level $Et_{off}$ as shown in FIG. 17(f), and signal charges $Cs_2$ stored in the photodetector 10 until then are transferred to the CCD channel 12d through the n type impurity region 4b. When the driving clock CLt falls at time Ta1, the potential level of the transfer gate 4 returns to the level $Et_{off}$, and the transfer gate 4 closes. At this time, the potential level Eid of the infrared detector 1 is reset to the ON level $Et_{on}$ (energy level $\phi t$) of the transfer gate 4.

More specifically, when the transfer gate 4 opens, the platinum silicide layer 1a in its floating state is connected to the CCD channel 12d whose potential level is lower than the potential level of the platinum silicide layer 1a, whereby the signal charges $Cs_2$ are transferred toward the CCD channel 12a through the platinum silicide layer 1a and the gate 4. When the transfer gate 4 is closed, the platinum silicide layer 1a is disconnected from the CCD channel 12d and returns to the floating state, so that the platinum silicide layer 1a is charged in accordance with the quantity of transferred charges. In addition, the transfer of signal charges is carried out until the potential level of the infrared detector 1 becomes equal to the lowered potential level $Et_{on}$ of the transfer gate 4.

Meanwhile, in the infrared detector 1, signal charges $Cs_1$ are stored in accordance with the amount of incident infrared light during a period of $Ta1 < t < ta2$, until the shutter gate 5 opens, as shown in FIG. 17(b). When the driving clock Cls of the shutter gate 5 rises at time Ta2, the shutter gate 5 opens, that is, potential level of the shutter gate 5 drops to an ON level $Es_{on}$ from an OFF level Es$_{off}$ as shown in FIG. 17(c), and the signal charges Cs1 stored in the photodetector 10 until then are drawn into the n type impurity region of the overflow drain 13 through the n type impurity region 15b. When the driving clock CLs falls at time Ta3, the potential level of the shutter gate 5 returns to the level Es$_{off}$ and the shutter gate 5 closes as shown in FIG. 17(d). At this time, the potential level Eid of the infrared detector 1 is reset to the ON level Es$_{on}$ of the shutter gate 5 (energy level $\phi$s) like the above-described opening and closing operations of the transfer gate 4. This reset level $\phi$s of the shutter gate 5 is equal to the reset level $\phi$t of the transfer gate 4.

Thereafter, in the infrared detector 1, signal charges Cs2 are stored in accordance with the amount of incident infrared light as shown in FIG. 17(e) during a period of Ta3<t<ta4 until the transfer gate 5 opens, i.e., during a shutter period Xs. The signal charges Cs2 stored during the shutter period Xs are transferred to the CCD channel 12 within a pulse period of the driving clock Clt of the transfer gate 4, i.e., a period of Ta4≦t<Ta5 (FIG. 17(f)). Thereafter, the charge read operation from the infrared detector 1 to the CCD 12 is carried out in the charge read cycle Xr as described with respect to FIGS. 17(a) to 17(f).

In the charge read cycle Xr, the CCD 12 transfers signal charges from the infrared detector 1. Hereinafter, the charge transfer operation will be described with reference to FIGS. 18 to 20.

FIG. 18 is a plan view illustrating the structure of CCD transfer gates of the linear image sensor 200 and connections between the CCD transfer gates and driving clocks therefor. FIG. 19 is a schematic diagram illustrating waveforms of three phase driving clocks $\phi$1 to $\phi$3 for the CCD 12 in addition to the driving clocks CLt and CLs of FIG. 16. FIG. 20 is a schematic diagram for explaining transfer of signal charges in an infrared detector to a position corresponding to the next infrared detector in the CCD 12.

As shown in FIG. 18, the CCD 12 is a three-phase driving CCD which includes three transfer gates 12a to 12c for one infrared detector 1. In this structure, a transfer gate 4 is disposed between each infrared detector 1 and each transfer gate 12a, and signal charges generated in the infrared detector 1 are transferred to a region directly under the transfer gate 12a of the CCD channel 12d. In addition, a shutter gate 15 is disposed between each infrared detector 1 and the overflow drain 13.

As shown in FIG. 20, when a pulse of the driving clock CLt is applied to the transfer gate input I$_t$ in the period of Ta0≦t<Ta1 in which potential wells are formed directly under the transfer gates 12a, signal charges A to D are sent to the potential wells under the first transfer gates 12a from the respective infrared detectors 1. When the driving clock CLt falls down at time Ta1, the charge transfer operation begins.

More specifically, phases of the CCD driving signals $\phi$1 to $\phi$3 are different by 120 degrees from each other. Therefore, the potential wells are formed beneath the first and second transfer gates 12a and 12b during the first transfer period of Ta1≦t<t1, directly beneath the second transfer gates 12b during the second transfer period of t1≦t<t2 and beneath the second and third transfer gates 12b and 12c during the third transfer period of t2≦t<t3. When the fourth transfer period of t3≦t<t4 and the fifth transfer period of t4≦t<t5 have passed away, signal charges A to D are present in the potential wells beneath the next transfer gates 12a. That is, during the above-described period of Ta0≦t<t6, the signal charges A to D move a distance corresponding to one infrared detector. The CCD 12 repeats the transfer operation until the next rise of the driving clock CLt of the transfer gate 4 to finish the transfer operation.

In the linear image sensor 200 having the electron shutter mechanism, however, if the potential level $\phi$t of the infrared detector 1 which is reset at the time of the opening and closing operations of the transfer gate 4 is different from the potential level $\phi$s of the infrared detector 1 which is reset at the time of the opening and closing operations of the shutter gate 15 even to a small degree, an accurate amount of the infrared light cannot be detected. That is, the detector reset level $\phi$t at the time of reading charges depends on characteristics of the transfer gate transistor and the detector reset level $\phi$s at the time of sweeping charges depends on characteristics of the shutter gate transistor. Therefore, if there is a difference, even a slight difference, in characteristics between the transfer gate transistor and the shutter gate transistor due to variations in manufacturing, the reset level of the infrared detector at the time of transferring charges from the infrared detector to the CCD is unfavorably different from the reset level of the infrared detector at the time of sweeping charges into the overflow drain, whereby some signal charges remain in the infrared detector without being transferred to the CCD or excessive charge is transferred to the CCD.

This problem will be described in more detail. FIGS. 21(a)-21(f) and FIGS. 22(a)-22(f) illustrate potential profiles each corresponding to the potential profile of FIGS. 17(a)-17(f). FIGS. 21(a)-21(f) show a case where the potential level $\phi$s of the infrared detector 1 which is reset at the time of sweeping charges is lower than the potential level $\phi$t of the infrared detector 1 which is reset at the time of transferring charges. In this case, when the shutter gate 5 operates, charges C0 are excessively drawn into the overflow drain in addition to the stored charges Cs1 as shown in FIG. 21(c). Thereafter, during the charge read operation, signal charges Cs3 at a storage level lower than the difference between the level Et$_{on}$ at the ON time of the transfer gate 4 and the level Es$_{on}$ at the ON time of the shutter gate 5, i.e., an energy difference of $\phi$t−$\phi$s, unfavorably remain in the infrared detector 1.

On the other hand, FIGS. 22(a)-22(f) show a case where the potential level $\phi$s of the infrared detector 1 which is reset at the time of sweeping charges is higher than the potential level $\phi$t of the infrared detector 1 which is reset at the time of transferring charges. In this case, when the shutter gate 5 operates, a part of the stored charges Csl, i.e., charges Cs5, are only drawn into the overflow drain leaving charges Cs4 as shown in FIG. 22(c). Thereafter, during the charge read operation, charges Cs4 in a quantity equivalent to the difference between the level Et$_{on}$ at the ON time of the transfer gate 4 and the level Es$_{on}$ at the ON time of the shutter gate 5, i.e., an energy difference of $\phi$t−$\phi$s, are excessively sent to the CCD in addition to the signal charges Cs2. As the result, signal contrast is lowered.

In order to solve these problems, an improved linear image sensor has been developed by the inventor of the present invention.

FIGS. 23(a) and 23(b) are diagrams illustrating the improved linear image sensor, in which FIG. 23(a) is a plan view schematically showing a layout of elements constituting the sensor and FIG. 23(b) is a sectional view taken along a line XXIIIb—XXIIIb of FIG. 23(a).

In these figures, reference numeral 300 designates the improved linear image sensor. In the sensor 300, an overflow drain 3 and a CCD 12 are disposed on one side of an array of infrared detectors 1 and the CCD 12 is disposed between the overflow drain 3 and the infrared detector array. Shutter gates 5 are disposed between the CCD 12 and the overflow drain 3, so that signal charges generated in the infrared detector array are drawn into the overflow drain 3 through the CCD 12. In addition, a p type impurity region 5b is disposed between a transfer channel 12b of the CCD 12 and an n type impurity region of the overflow drain 3, and a polysilicon gate 5a is disposed on the p type impurity region 5b through a gate insulating film 10a. The p type region 5b and the polysilicon gate 5a constitute a shutter gate transistor. Other structures are the same as those of the linear image sensor shown in FIG. 15.

FIG. 24 is a plan view illustrating a structure of CCD transfer gates of the linear image sensor 300 and connections between the CCD transfer gates and driving clocks therefor. FIGS. 25(a)–25(g) are schematic diagrams illustrating potential profiles during a charge read operation of the linear image sensor 300 in a cross-section taken along the line XXIIIb—XXIIIb of FIG. 23(a). FIG. 26 is a schematic diagram illustrating waveforms of signals applied to the respective gates of the linear image sensor 300. The charge read operation will be described using these figures.

First of all, when the driving clock CLt of the transfer gate 4 rises at time Ta0, the transfer gate 4 opens, that is, the potential level of the gate 4 falls to an ON level $Et_{on}$ from an OFF level $Et_{off}$, and signal charges Cs stored in the infrared detector 1 until then are transferred to the CCD channel 12d through the n type impurity region 4b (FIG. 25(f)). When the driving clock CLt falls at time Ta1, the potential level of the gate 4 returns to the level $Et_{off}$ and the gate 4 closes. At this time, the potential level Eid of the infrared detector 1 is reset to the ON level $Et_{on}$ of the transfer gate 4 (an energy level $\phi t$) for the same reason as in the case of the sensor 200 shown in FIG. 15.

At the same time, charge transfer operation begins in the CCD 12. Thereafter, during the period of Ta1≦t<Tb2 of FIG. 25(a), i.e., the transfer period Xt of FIG. 26, signal charges are successively stored in the infrared detector 1 as shown in FIG. 25(a) while the charge transfer operation is carried on in the CCD 12. Thereafter, during the period of Tb2≦t<Tb3, i.e., the period until the shutter gate 5 opens, signal charges Ce are stored in the infrared detector 1 in accordance with the amount of incident infrared light as shown in FIG. 25(b). When the driving clock CLs of the shutter gate 5 and the driving clock CLt of the transfer gate 4 rise at time Tb3, these gates 5 and 4 open, that is, the potential levels of the gates 5 and 4 fall to the ON levels $Es_{on}$ and $Et_{on}$ from the OFF levels $Es_{off}$ and $Et_{off}$, respectively, whereby signal charges Ce stored in the infrared detector 1 are drawn into the n type impurity region of the overflow drain 3 through the channel 12b of the CCD 12.

When the driving clocks CLs and CLt rise at time Tb4, the potential levels of the gates 5 and 4 return to the levels of $Es_{off}$ and $Et_{off}$, respectively, and the gates 5 and 4 close (FIG. 25(d)). At this time, the potential level Eid of the infrared detector 1 is reset to the ON level $Et_{on}$ ($\phi t$) of the transfer gate 4, regardless of the ON level $Es_{on}$ of the shutter gate 5, as in the case of the opening and closing operations of the transfer gate 4, so that the potential level of the infrared detector 1 in the charge read operation is not different from that in the charge drain operation.

Thereafter, in the infrared detector 1, signal charges Cs are stored in accordance with the amount of incident infrared light until the transfer gate 4 opens, during the shutter period Xs, i.e., the period of Tb4<t<Tb5 (FIG. 25(e)). Charges Cs stored during this period are transferred to the CCD channel 12 within the pulse period of the driving clock CLt of the transfer gate 4, i.e., the period of Tb5≦t<Tb6 (FIG. 25(f)). When the driving clock CLt rises at time Tb6, the CCD 12 begins the charge transfer operation. Thereafter, charges are successively transferred from the infrared detector 1 to the CCD 12 in the charge read cycle Xr as shown in FIGS. 25(a) to 25(g).

In order to achieve the above-described operation, it is necessary to set the potential levels to be increasingly deep in the order of the transfer gate ($Et_{on}$), the CCD channel ($E_{cc}$), the shutter gate ($Es_{on}$) and the overflow drain ($Eod$). This is easily achieved by controlling impurity concentrations of the p type and n type impurity regions of the respective elements.

In the above-described linear image sensor 300, unnecessary charges generated in the infrared detector are drawn into the charge exhaust part like the overflow drain through the charge transfer part. This idea is also disclosed in Japanese Published Patent Applications 62-200761 and 60-120555. More specifically, Japanese Published Patent Application 62-200761 discloses a solid-state imaging element in which a charge transfer part is disposed between a one-dimensional array of infrared detectors and an overflow drain, and charges flowing into the charge transfer part due to excess light incident on the infrared detector are drawn into the overflow drain. However, this device has no electron shutter mechanism. In addition, Japanese Published Patent Application 60-120555 discloses a solid-state imaging device in which two CCD registers are disposed on opposite sides of a one-dimensional array of infrared detectors and two dummy shift registers are disposed on the outer sides of the CCD registers and charges remaining in the infrared detectors are drained into the dummy shift registers through the CCD shift registers.

In the above-described linear image sensor 300, since the signal charges Ce stored in the infrared detector 1 are drawn into the overflow drain 3 through the CCD 12, during charge drain operation, the charge transfer operation of the CCD 12, transferred signal charges are sometimes mixed with the drawn charges. In this case, the shutter gate 5 cannot be turned ON during the transfer operation of the CCD 12. In order to avoid this, the CCD transfer period and the charge drain period are set in different periods of time. However, the shutter period Xs is limited to a short period after the charge transfer period Xt in the charge read cycle Xr, so that signal charges are not sufficiently stored especially when the amount of incident infrared light is small.

SUMMARY OF THE INVENTION

It is an object of the present invention to provide a linear image sensor in which a perfect electron shutter operation is conducted without a difference in reset levels of a detector between a charge read operation and a charge drain operation, the shutter period is set in an arbitrary period in a charge read cycle, and a sufficient amount of signal charges are stored even if the amount of incident infrared light is small.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a linear image sensor, a charge transfer part is disposed between a one-dimensional array of photodetectors and an overflow drain. The charge transfer part comprises a CCD including four or more CCD transfer gates for each photodetector and for transferring signal charges sent from the photodetector in a direction of the photodetector array, transfer gates controlling charge transfer from the photodetector array to the CCD, and a shutter gate controlling charge transfer from the charge transfer part to the overflow drain. Each transfer gate is disposed between each photodetector and a prescribed one of the four or more CCD transfer gates corresponding to the photodetector, and each shutter gate is disposed between the prescribed CCD transfer gate and the overflow drain. The four or more CCD transfer gates are controlled by four or more phase driving clocks. Therefore, during the charge transfer operation, there is a state where at least three adjacent CCD transfer gates are all closed, so that signal charges are drained from the photodetector into the overflow drain through the CCD transfer gate in the middle of the three CCD transfer gates without mixing the drained signal charges with signal charges transferred by the CCD. That is, the charge drain operation is carried out during the charge transfer operation in the charge transfer part, whereby the timing for opening the shutter gate can be set at an arbitrary time in the charge read cycle.

According to a second aspect of the present invention, the above-described CCD includes five CCD transfer gates for each photodetector and the five CCD transfer gates are controlled by five-phase driving clocks for charge transfer. Therefore, even when three adjacent CCD transfer gates among the five CCD transfer gates are used for the charge drain operation during the charge transfer operation, the two remaining two CCD transfer gates are used for the charge transfer operation, so that signal charges from the photodetector are received by a potential well equivalent to the two CCD transfer gates and the amount of transferred signal charges is doubled.

According to a third aspect of the present invention, the above-described CCD includes four CCD transfer gates for each photodetector and these CCD transfer gates are controlled by four-phase driving clocks for charge transfer. Therefore, as compared with the five-phase driving CCD, one CCD transfer gate and a driving clock therefor are dispensed with, whereby the structure of the CCD is simplified.

According to a fourth aspect of the present invention, in a method for driving a linear image sensor, a CCD including four or more CCD transfer gates for each photodetector of a one-dimensional array of photodetectors is prepared, four or more phase driving clocks are applied to the CCD transfer gates for transferring signal charges from the photodetector, and a transfer gate disposed between each photodetector and a prescribed one of the four or more CCD transfer gates and a shutter gate disposed between the prescribed CCD transfer gate and the charge drain circuit are turned on when the CCD transfer gates at opposite sides of the prescribed CCD transfer gate are turned off, whereby signal charges sent from each photodetector are transferred by the charge transfer circuit, and at the same time and, signal charges are drained through, the charge transfer circuit.

BRIEF DESCRIPTION OF THE DRAWINGS

FIGS. 3(a)-3(g) are diagrams illustrating potential profiles in a cross-section taken along a line III—III of FIG. 1 during the charge read operation;

FIGS. 8(a)-8(g) are diagrams illustrating potential profiles in a cross section taken along a line VIII—VIII of FIG. 6 during the charge read operation;

FIGS. 15(a) and 15(b) are diagrams illustrating an infrared linear image sensor with an electron shutter mechanism according to the prior art, in which FIG. 15(a) is a schematic plan view and FIG. 15(b) is a sectional view taken along a line XVb—XVb of FIG. 15(a);

FIGS. 17(a)-17(f) are diagrams illustrating potential profiles in a cross-section taken along a line XVb—XVb of FIG. 15(a) during the charge read operation of the prior art infrared linear image sensor;

FIGS. 21 (a)-21(f) are diagrams illustrating potential profiles for explaining problems in the case where the potential of the transfer gate during an ON time is higher than that of the shutter gate;

FIGS. 22(a)-22(f) are diagrams illustrating potential profiles for explaining problems in the case where the potential of the transfer gate during an ON time is lower than that of the shutter gate;

FIGS. 23(a) and 23(b) are diagrams illustrating an infrared linear image sensor according to the prior art wherein the problems of the image sensor of FIG. 15 are solved, in which FIG. 23(a) is a schematic plan view and FIG. 23(b) is a sectional view taken along a line XXIIIb—XXIIIb of FIG. 23(a);

FIGS. 25(a)—25(g) are diagrams illustrating potential profiles in a cross-section taken along the line XXIIIb—XXIIIb during the charge read operation of the prior art image sensor.

DETAILED DESCRIPTION OF THE PREFERRED EMBODIMENTS

Figure 1:
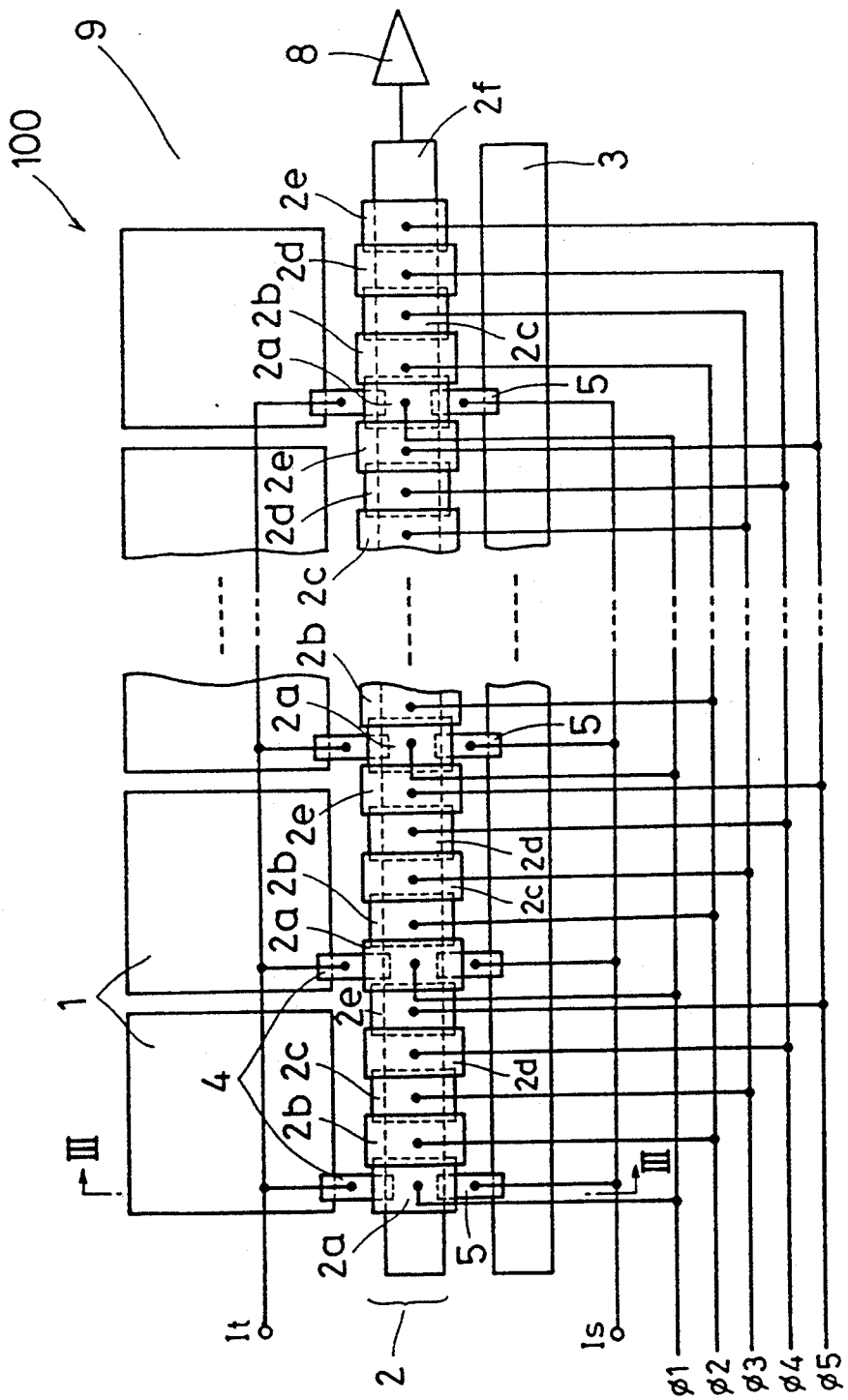
FIG. 1 is a plan view illustrating a structure of an infrared linear image sensor according to a first embodiment of the present invention.
Figure 24:
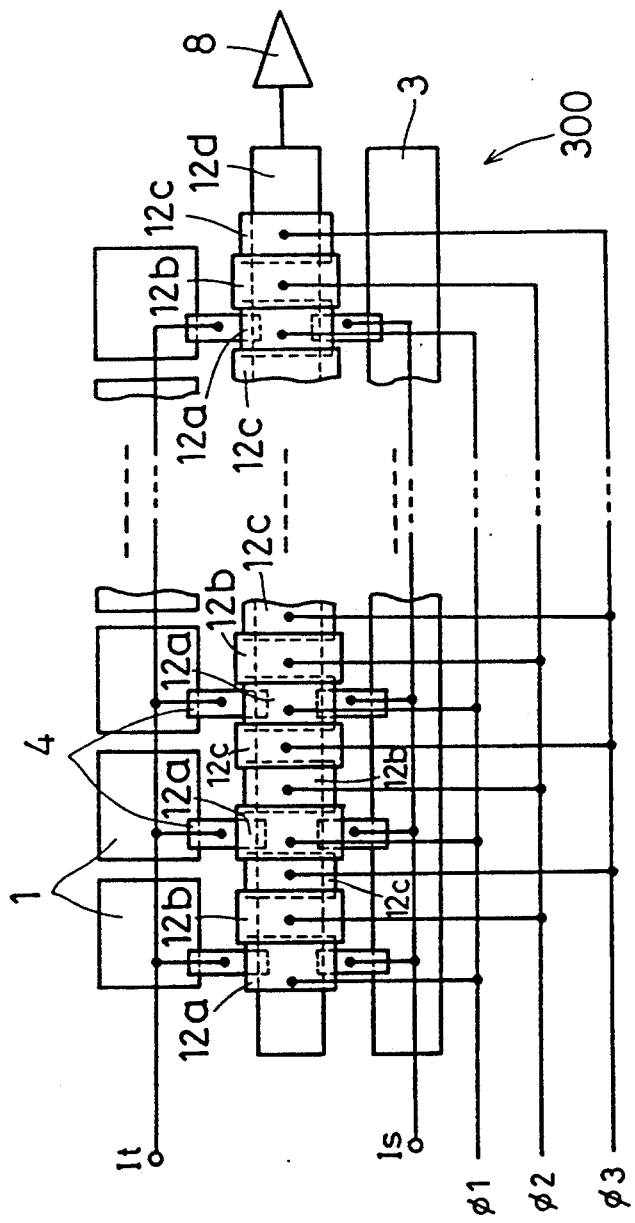
FIG. 24 is a plan view illustrating a layout of gate electrodes of respective elements in the prior art image sensor.
Figure 26:
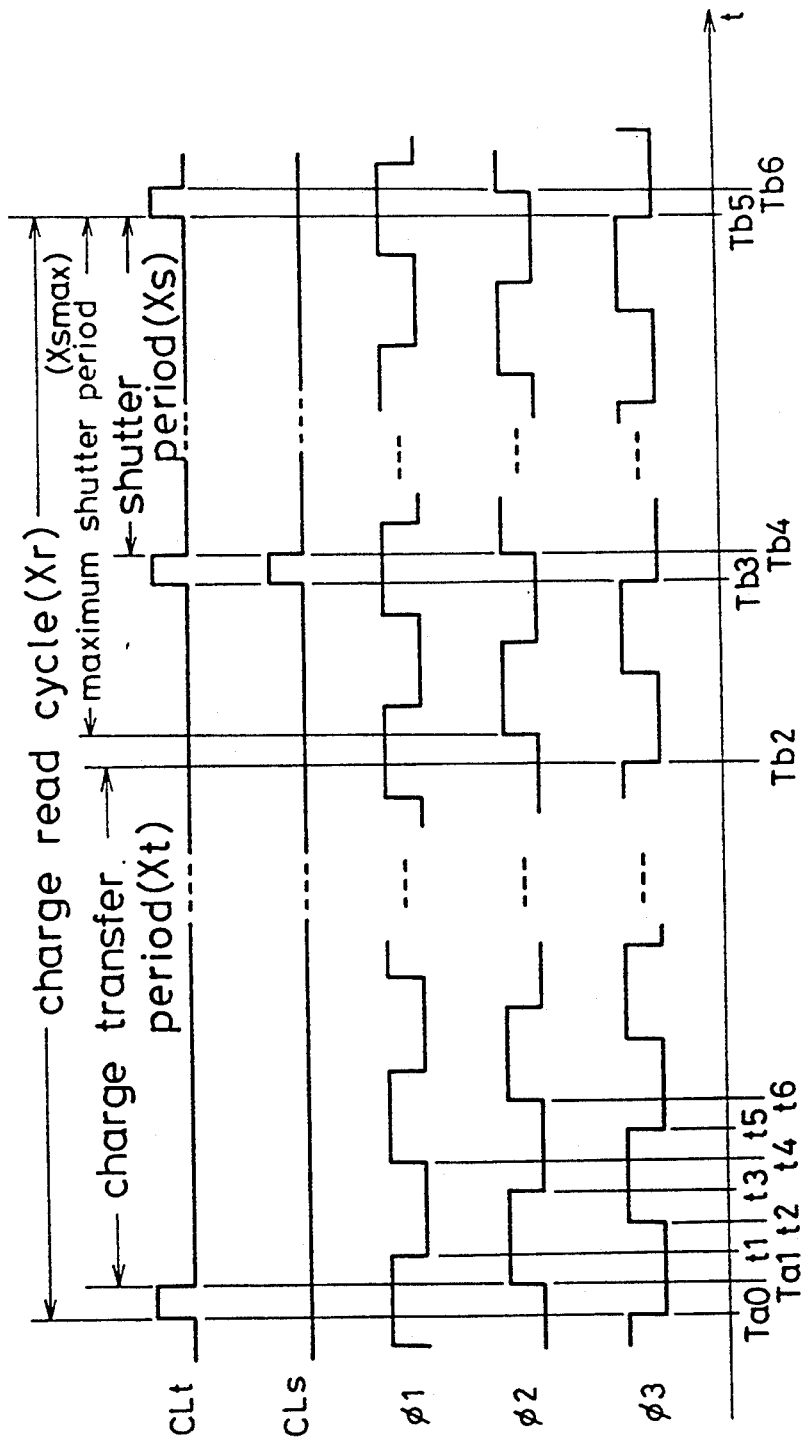
FIG. 26 is a diagram illustrating waveforms of signals for conducting the charge read operation of the prior art image sensor.

FIG. 1 is a plan view showing a structure of an infrared linear image sensor according to a first embodiment of the present invention, in which the same reference numerals as in FIG. 24 designate the same or corresponding parts. In FIG. 1, a CCD 2 is driven by first to fifth phase clock signals $\phi1$ to $\phi5$ and includes first to fifth transfer gates 2a to 2e for one infrared detector 1. The clock signals $\phi1$ to $\phi5$ are applied to the transfer gates 2a to 2e, respectively. Other elements are the same as those of the conventional linear image sensor shown in FIG. 24, that is, the transfer gate 4 is disposed between the first transfer gate 2a and the infrared detector 1 and the shutter gate 5 is disposed between the first transfer gate 2a and the overflow drain 3. In addition, reference numeral 2f designates an n type channel region of the CCD 2.

A description is given of the operation.

Figure 2:
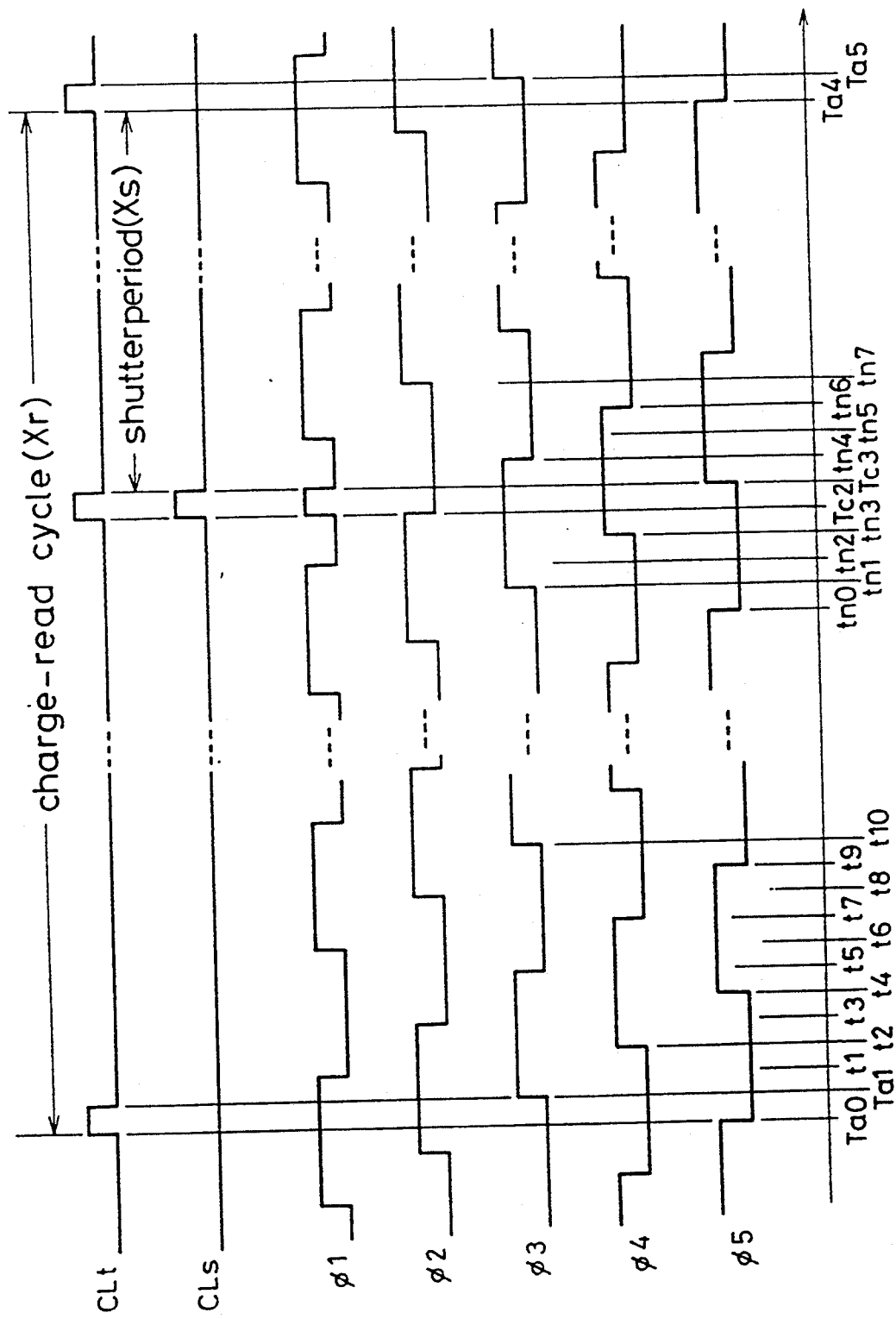
FIG. 2 is a diagram illustrating waveforms of signals for explaining a charge read operation of a five-phase driving CCD in the linear image sensor of FIG. 1.
Figure 4:
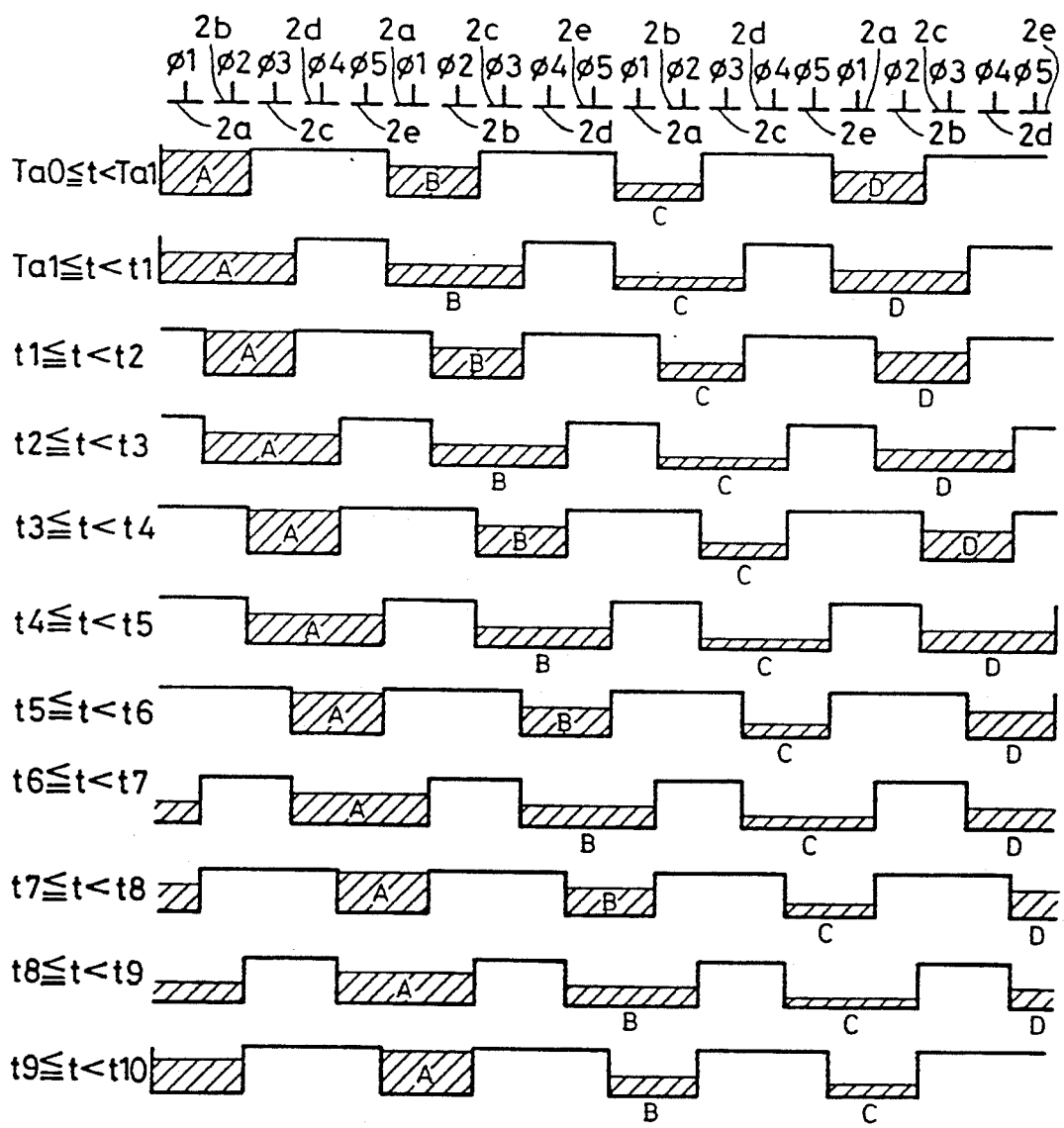
FIG. 4 is a diagram illustrating potential profiles in a charge transfer direction during a charge transfer operation of the five-phase CCD of FIG. 2.
Figure 5:
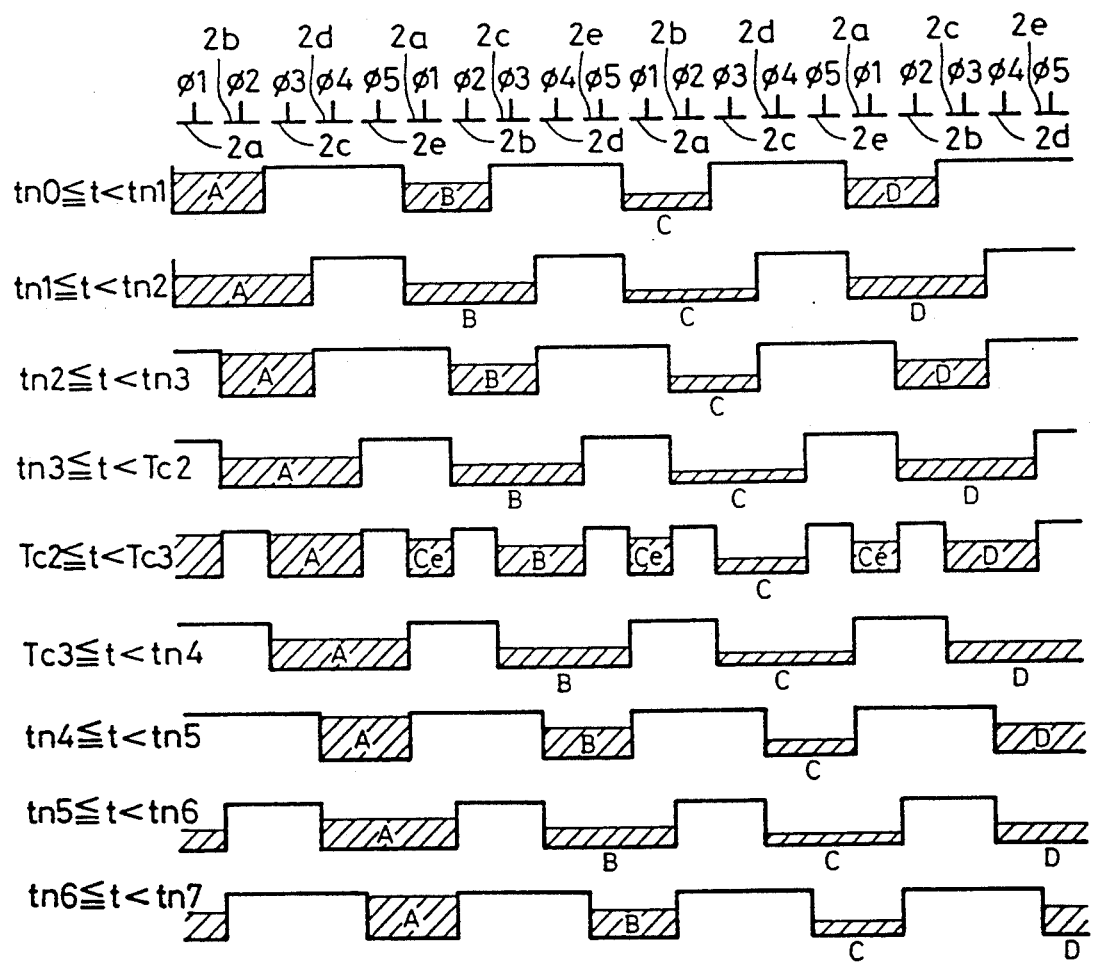
FIG. 5 is a diagram illustrating potential profiles of the CCD for explaining stored charge drain operation during the charge transfer operation of the five-phase CCD.

FIG. 2 illustrates clock signals applied to the respective gates of the linear image sensor of FIG. 1 during the charge read operation. FIGS. 3(a)-3(g) illustrate potential profiles in a cross section taken along a line III—III of FIG. 1 during the charge read operation. FIG. 4 illustrates a manner of transferring signal charges in the CCD. FIG. 5 illustrate a timing for draining signal charges during the charge transfer operation.

First of all, an ordinary charge transfer operation of the CCD 2 will be described.

During a period of $Ta0 \leq t < Ta1$ in which a potential well is created directly under the first and second transfer gates 2a and 2b of the CCD 2, the transfer gate control clock CLt rises at time Ta0 and the transfer gate 4 opens as shown in FIG. 3(f), whereby signal charges Cs stored in the infrared detector 1 flow into the potential well. When the control clock CLt falls at time Ta1, the transfer gate 4 closes as shown in FIG. 3(g) and transfer of the signal charges Cs begins as shown in FIG. 4. In FIG. 4, reference characters A to D designate charges transferred from the infrared detectors to the potential wells beneath the first and second transfer gates 2a and 2b corresponding to the respective infrared detectors.

This transfer operation will be described with reference to FIG. 4. In FIG. 4, since the CCD driving clocks have five phases, i.e., the phases of clocks $\phi1$ to $\phi5$ are delayed by 72 degrees ($2\pi/5$) from each other, a period for transferring signal charges from a position corresponding to an infrared detector to a position corresponding to the next infrared detector is divided into first to tenth transfer periods.

First of all, during the first transfer period of $Ta1 \leq t < t1$, the potential wells created beneath the first and second transfer gates 2a and 2b extend beneath the third transfer gates 2c, and the potential wells beneath the first transfer gates 2a disappear during the second transfer period of $t1 \leq t < t2$, whereby the signal charges A to D transferred from the infrared detectors 1 to the CCD 2 move a distance equivalent to one transfer gate.

Subsequently, during the third transfer period of $t2 \leq t < t3$ and the fourth transfer period of $t3 \leq t < t4$, the signal charges A to D move a distance equivalent to one transfer gate. Thereafter, the signal charges move in this way during the fifth and sixth transfer periods, the seventh and eighth transfer periods, and the ninth and tenth transfer periods, whereby the signal charges A to D move a distance equivalent to one infrared detector 1.

Repeating the transfer operation, the CCD 2 successively outputs the signal charges through the output amplifier 8.

A description is given of a shutter operation during the charge transfer operation, i.e., an operation for draining signal charges out of the infrared detectors 1.

FIGS. 3(a)-3(g) show potential profiles in a cross-section taken along a line III—III of FIG. 1 during the transfer period of $tn0 \leq t \leq tn7$ in which the shutter operation is carried out. Especially FIG. 3(a) shows a period of $tn0 < t < tn1$ in which a potential well is created beneath the first transfer gate 2a, and FIG. 3(b) shows the third transfer period of $tn3 \leq t < Tc2$ prior to the fourth transfer period of $Tc2 < t < Tc3$ in which the shutter operation is carried out. In the fourth transfer period, no potential well is created beneath the first transfer gate 2a and the fifth and second transfer gates 2e and 2b disposed at opposite sides of the first transfer gate 2a.

In the transfer cycle for conducting the shutter operation during the charge transfer operation, the driving clock $\phi1$ for the first transfer gate 2a and the transfer gate control clock CLt rise together with a shutter gate control clock CLs at time Tc2 in the fourth transfer period, whereby, as shown in FIG. 3(c), the potential levels of the transfer gate 4 and the shutter gate 5 fall down to the levels $Et_{on}$ and $Es_{on}$, respectively, and at the same time, the potential level of the first transfer gate 2a falls to the level Ecc at which the transfer well is created. Thereby, signal charges Ce stored in the infrared detectors 1 are drawn into the overflow drain 3 through the potential wells beneath the first transfer gates 2a as shown in FIG. 5.

When the control clocks CLt and CLs fall as shown in FIG. 3(d), the infrared detector 1, the CCD 2, and the overflow drain 3 are separated from each other. Thereafter, storage of signal charges is carried on in the infrared detectors 1 and signal charges are successively transferred through the first transfer gates 2a in the CCD 2. FIG. 3(e) shows a potential profile at time tn7 during such an operation.

When the transfer gate control clock CLt rises at time Ta4, the transfer gate 4 opens as shown in FIG. 3(f) and signal charges Cs stored in the infrared detector 1 flow into the potential well beneath the first and second transfer gates 2a and 2b. When the control clock CLt falls at time Ta5, the transfer gate 4 closes as shown in FIG. 3(g) and transfer of the signal charges Cs starts in the CCD 2.

According to the first embodiment of the present invention, the CCD 2 disposed between the one-dimensional array of infrared detectors 1 and the overflow drain 3 includes five transfer gates 2a to 2e for each infrared detector 1, and five-phase driving clocks $\phi 1$ to $\phi 5$ are applied to the transfer gates 2a to 2e, respectively. Therefore, during the charge transfer operation, there is a state where three adjacent transfer gates are all closed. When the three adjacent transfer gates 2e, 2a, and 2b are all closed, signal charges are drained from the infrared detector 1 into the overflow drain 3 through the first transfer gate 2a in the center of the three transfer gates without mixing the drained signal charges into the signal charges transferred by the CCD 2. That is, the signal drain operation is conducted in the charge transfer part during the charge transfer operation, whereby the timing for opening the shutter gate can be set at an arbitrary time in the charge read cycle.

In addition, the CCD 2 includes the five transfer gates 2a to 2e for one infrared detector and these transfer gates 2a to 2e are controlled by the five-phase driving clocks $\phi 1$ to $\phi 5$, respectively. Therefore, a margin equivalent to one transfer gate is obtained in the charge transfer operation and this can be used for the transfer operation. As a result, signal charges from the infrared detector are transferred to a potential well equivalent to two transfer gates, so that the amount of the transferred charges can be doubled.

Furthermore, a difference in detector reset levels between the charge read operation and the charge drain operation can be avoided. More specifically, in the charge storage period, the potential level Eid of the infrared detector 1 is reset to the potential level $Et_{on}$ of the transfer gate 4. In the charge drain period, a positive voltage is applied to the transfer gate 4 and the shutter gate 5, and the potential levels of the transfer gate 4 and the shutter gate 5 fall to the levels $Et_{on}$ and $Es_{on}$, respectively, as shown in FIG. 3(c), whereby signal charges Cs are transferred to the overflow drain 3 through the CCD channel 12. Also in this case, the potential level Eid of the detector is reset to the potential level $Et_{on}$ of the transfer gate 4. Therefore, the reset level of the detector only depends on the characteristics of the transistor of the transfer gate 4, and an energy level $\phi T$ is always obtained in the charge read period and the charge drain period, so that the both levels do not shift due to variations in manufacturing and a perfect electron shutter operation is performed.

While in the above-described first embodiment a five-phase driving CCD is employed, a four-phase driving CCD may be employed when a smaller amount of charges are transferred.

A description is given of a linear image sensor with a four-phase driving CCD in accordance with a second embodiment of the present invention.

Figure 6:
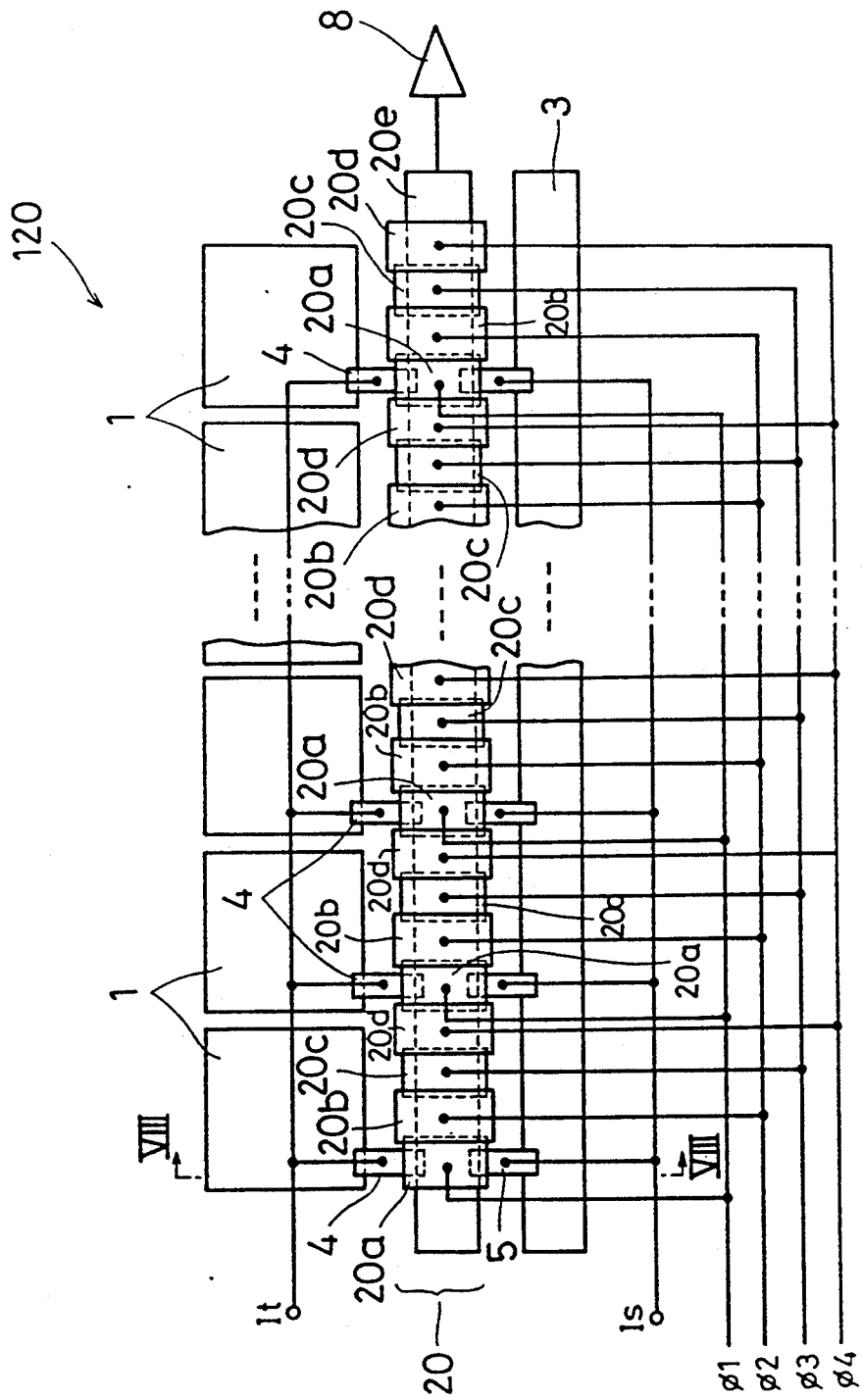
FIG. 6 is a plan view illustrating a structure of an infrared linear image sensor with a four-phase driving CCD in accordance with a second embodiment of the present invention.
Figure 7:
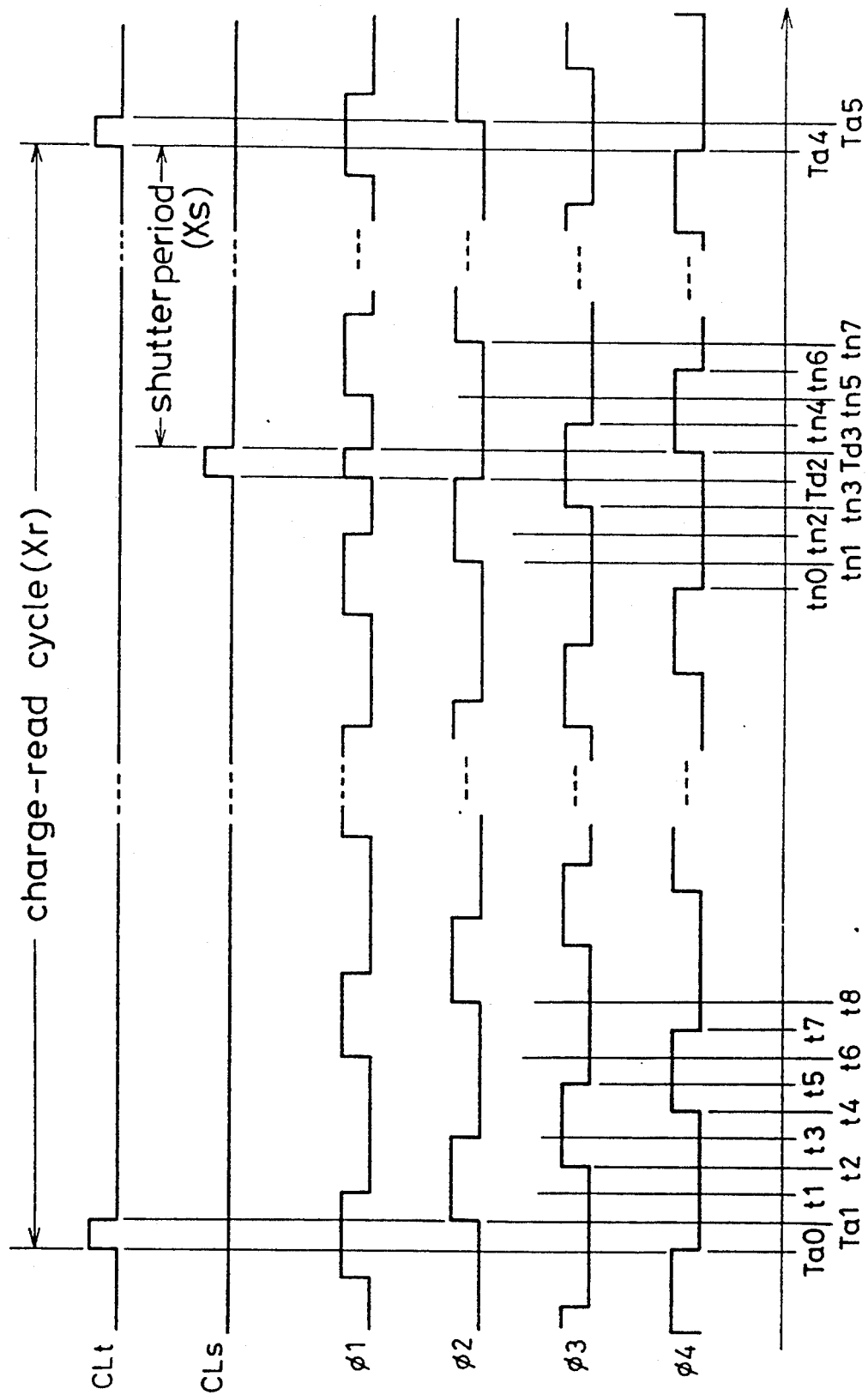
FIG. 7 is a diagram illustrating waveforms of signals for explaining a charge read operation of the four-phase driving CCD of the image sensor of FIG. 6.
Figure 9:
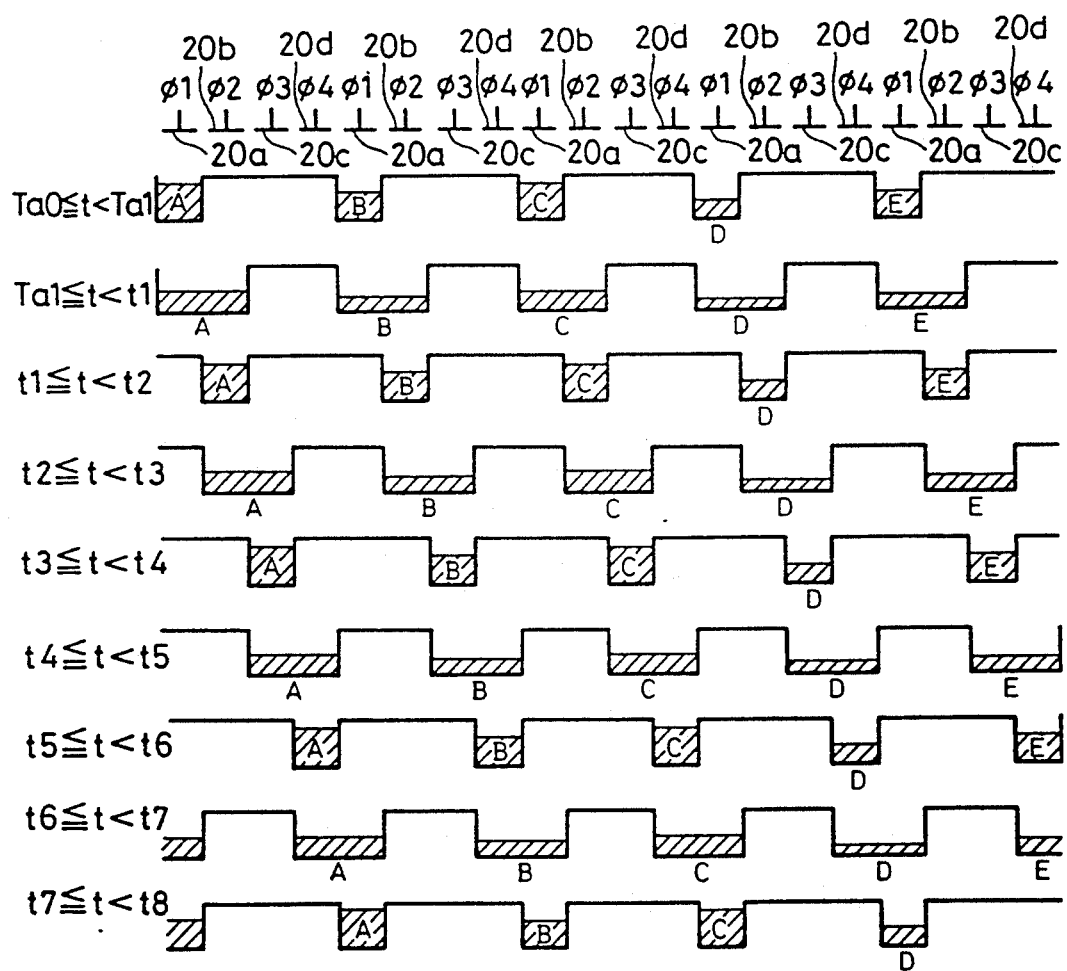
FIG. 9 is a diagram illustrating potential profiles in a charge transfer direction during the charge transfer operation of the four-phase CCD.
Figure 10:
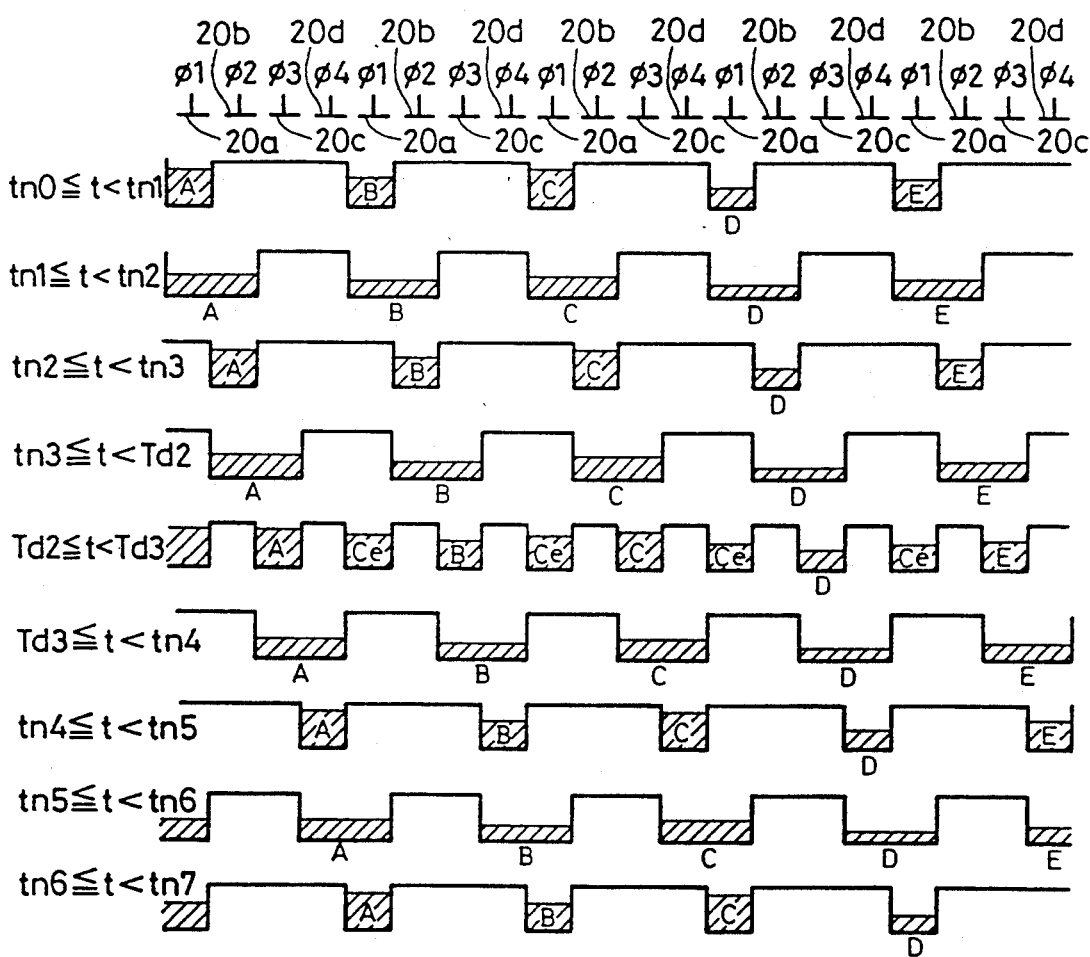
FIG. 10 is a diagram illustrating potential profiles for explaining stored charge drain operation during the charge transfer operation of the four-phase CCD.

FIGS. 6, 7, 8(a)-8(g), 9, and 10 are diagrams for explaining the linear image sensor according to the second embodiment of the present invention and correspond to FIGS. 1, 2, 3(a)-3(g), 4, and 5 used for explaining the first embodiment, respectively. FIG. 6 is a plan view illustrating a layout of each element of the infrared linear image sensor. FIG. 7 illustrates clock signals applied to the respective gates of the linear image sensor during the charge read operation. FIGS. 8(a)-8(g) illustrate potential profiles in a cross section taken along a line III—III of FIG. 6 during the charge read operation. FIG. 9 illustrates a manner of transferring signal charges in the CCD. FIG. 10 illustrates timing for draining signal charges during the charge transfer operation.

In this second embodiment, a four-phase CCD 20 includes first to fourth transfer gates 20a to 20d for one infrared detector 1, and four-phase driving clocks $\phi 1$ to $\phi 4$ are applied to the transfer gates 20a to 20d, respectively. Other structures are the same as those of the first embodiment. Reference numeral 20e designates an n type charge transfer channel of the CCD 20.

A description is give of the operation.

First of all, an ordinary charge transfer operation of the CCD 20 will be described.

During a period of $Ta0 \leq t < Ta1$ in which a potential well is created directly under the first transfer gate 20a of the CCD 20, the transfer gate control clock CLt rises at time Ta0 and the transfer gate 4 opens as shown in FIG. 8(f), whereby signal charges Cs stored in the infrared detector 1 flow into the potential well. When the control clock CLt falls at time Ta1, the transfer gate 4 closes as shown in FIG. 8(g) and transfer of signal charges Cs begins as shown in FIG. 9. In FIG. 9, reference characters A to E designate charges transferred from the infrared detectors to the potential wells beneath the first transfer gates 2a corresponding to the respective infrared detectors.

The transfer operation will be described with reference to FIG. 9. In FIG. 9, since the CCD driving clocks have four phases, i.e., the phases of clocks $\phi 1$ to $\phi 4$ are delayed by 90 degrees from each other, the period for transferring signal charges from a position corresponding to an infrared detector to a position corresponding to the next infrared detector is divided into first to eighth transfer periods.

First of all, in the first transfer period of $Ta1 \leq t < T1$, the potential wells created beneath the first transfer gates 20a extend beneath the second transfer gates 20b and the potential wells beneath the first transfer gates 2a disappear in the second transfer period of $t1 \leq t < t2$, whereby the signal charges A to E transferred from the infrared detectors 1 to the CCD 20 move a distance equivalent to one transfer gate.

Subsequently, during the third transfer period of $t2 \leq t < t3$ and the fourth transfer period of $t3 \leq t < t4$, the signal charges A to E move a distance equivalent to one transfer gate. Thereafter, the signal charges move in this way in the fifth and sixth transfer periods and the seventh and eighth transfer periods, whereby the signal charges A to E move a distance equivalent to one infrared detector 1.

Repeating the transfer operation, the CCD 20 successively outputs the signal charges through the output amplifier 8.

A description is given of a shutter operation during the charge transfer operation, i.e., an operation for draining signal charges out of the infrared detector 1.

FIGS. 8(a)-8(g) show potential profiles in a cross-section taken along a line VIII—VIII of FIG. 1 during the charge transfer period of $tn0 \leq t \leq tn7$ in which the shutter operation is carried out. Especially FIG. 8(a) shows a period $tn0 < t < tn1$ in which a potential well is created beneath the first transfer gate 20a, and FIG. 8(b) shows the third transfer period of $tn3 \leq t < Td2$ prior to the fourth transfer period of $Td2 \leq t < Td3$ in which the shutter operation is carried out. In the fourth transfer period, no potential well is created beneath the first transfer gate 20a and the fourth and second transfer gates 20d and 20b disposed at opposite sides of the first transfer gate 20a.

In the transfer cycle for conducting the shutter operation during the charge transfer operation, the driving clock $\phi 1$ for the first transfer gate 20a and the transfer gate control clock CLt rise together with the shutter gate control clock CLs at time Tc 2 in the fourth transfer period, whereby, as shown in FIG. 8(c), the potential levels of the transfer gate 4 and the shutter gate 5 fall to the levels $Et_{on}$ and $Es_{on}$, respectively, and at the same time, the potential level of the first transfer gate 20a falls to the level Ecc at which the transfer well is created. In this way, the signal charges Ce stored in the infrared detectors 1 are drawn into the overflow drain 3 through the potential wells beneath the first transfer gates 20a as shown in FIG. 10

When the control clocks CLt and CLs fall at time Td3, the infrared detector 1, the CCD 20, and the overflow drain 3 are separated from each other as shown in FIG. 8(d). Thereafter, storage of signal charges Cs is carried out in the infrared detector 1 while signal charges are successively transferred through the first transfer gate 20a in the CCD 20. FIG. 8(e) shows a potential profile at time t7 in such an operation.

When the transfer gate control clock CLt rises at time Ta4, the transfer gate 4 opens as shown in FIG. 8(f) and signal charges Cs stored in the infrared detector 1 flow into the potential well beneath the first transfer gate 20a. When the control clock CLt falls at time Ta5, the transfer gate 4 closes as shown in FIG. 8(g) and the transfer of the signal charges Cs begins in the CCD 2.

According to the second embodiment of the present invention, the CCD 20 of the charge transfer part disposed between the one-dimensional array of infrared detectors 1 and the overflow drain 3 includes the four transfer gates 20a to 20d for each infrared detector 1 and the four-phase driving clocks $\phi 1$ to $\phi 4$ are applied to the transfer gates 20a to 20d, respectively. Therefore, the signal charge drain operation is carried out during the signal charge transfer operation of the CCD 20 without mixing the drained charges with the transferred charges in the CCD. Therefore, the timing of opening the shutter gate can be set at an arbitrary time in the charge read cycle.

In addition, a transfer gate of the CCD and a driving clock therefor are decreased as compared with the five-phase driving CCD, whereby the structure of the linear image sensor is simplified. However, there is a disadvantage that the amount of transferred charges is reduced by half. Therefore, a five or more phase CCD is favorable in some cases.

In the above-described first and second embodiments of the present invention, the number of the transfer gates for each infrared detector is equal to the number of the phases of the transfer gate driving clocks. However, the transfer gates may be driven by driving clocks having a number of phases larger than the number of the transfer gates.

A description is given of a linear image sensor in which four transfer gates are prepared for each infrared detector and the transfer gates are driven by eight-phase driving clocks, in accordance with a third embodiment of the present invention.

Figure 11:
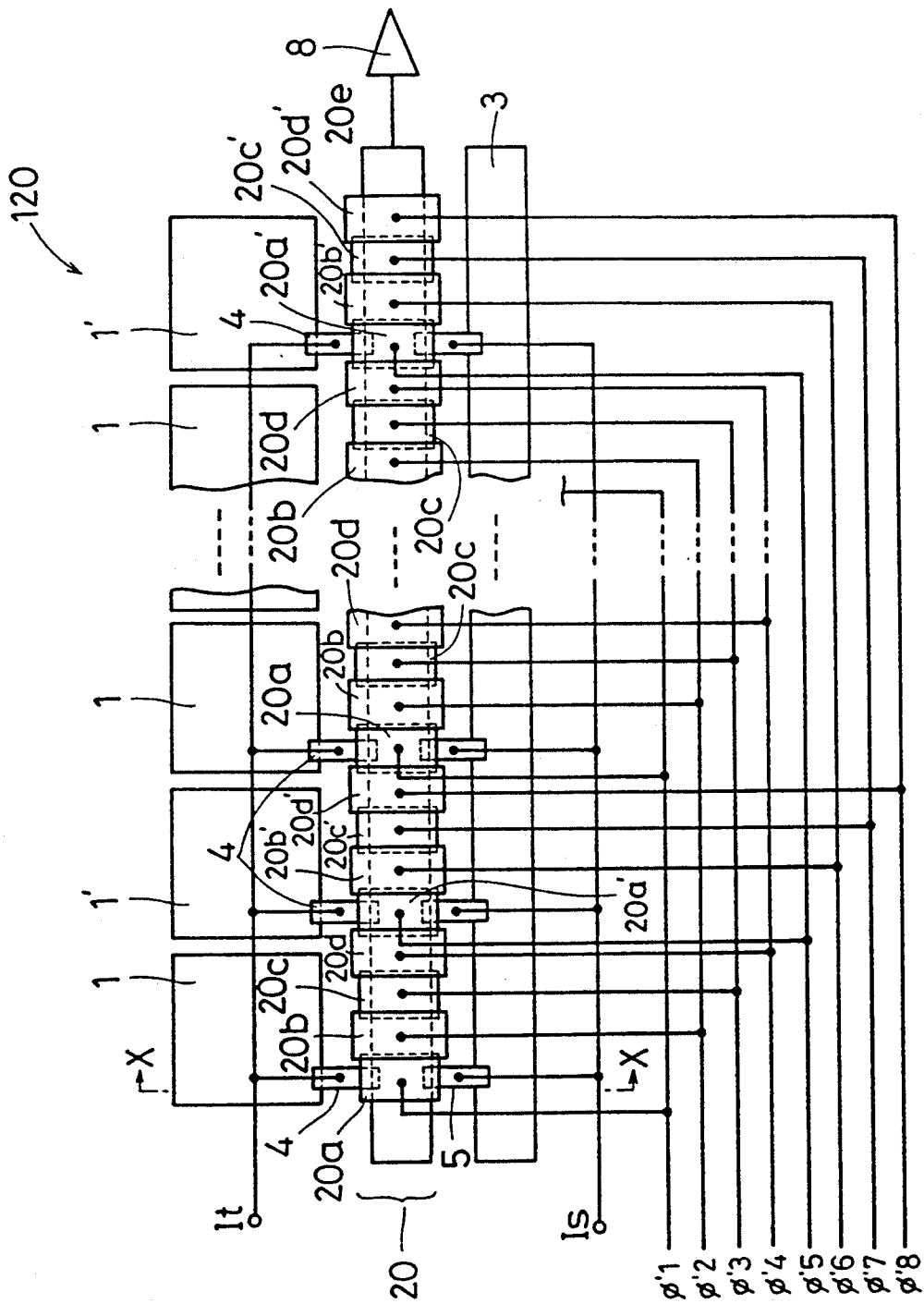
FIG. 11 is a plan view illustrating a structure of an infrared linear image sensor in which the CCD of the second embodiment is driven by eight-phase driving clocks, in accordance with a third embodiment of the present invention.
Figure 12:
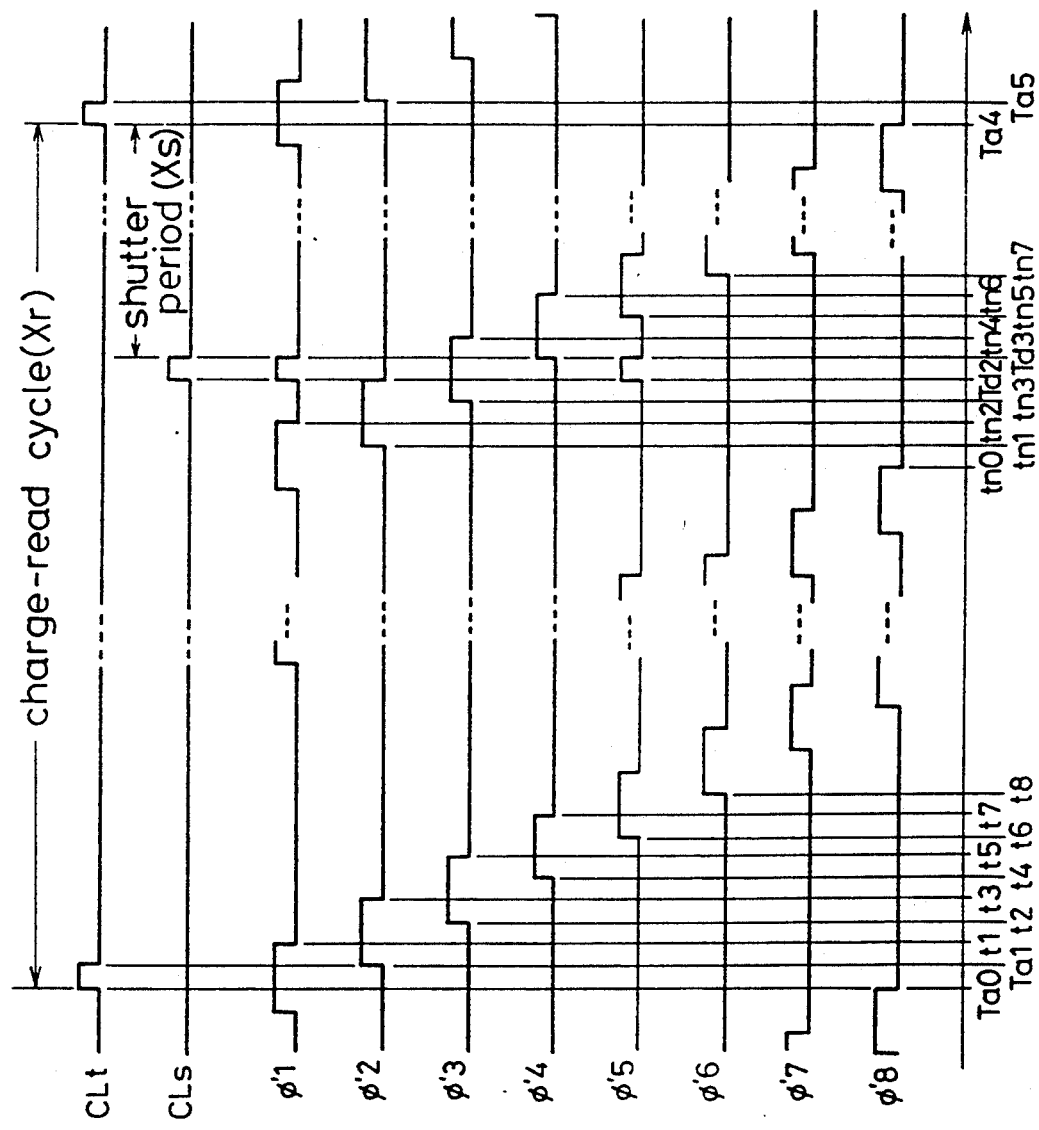
FIG. 12 is a diagram illustrating waveforms of signals for explaining a charge read operation of the eight-phase driving CCD of the image sensor of FIG. 11.
Figure 13:
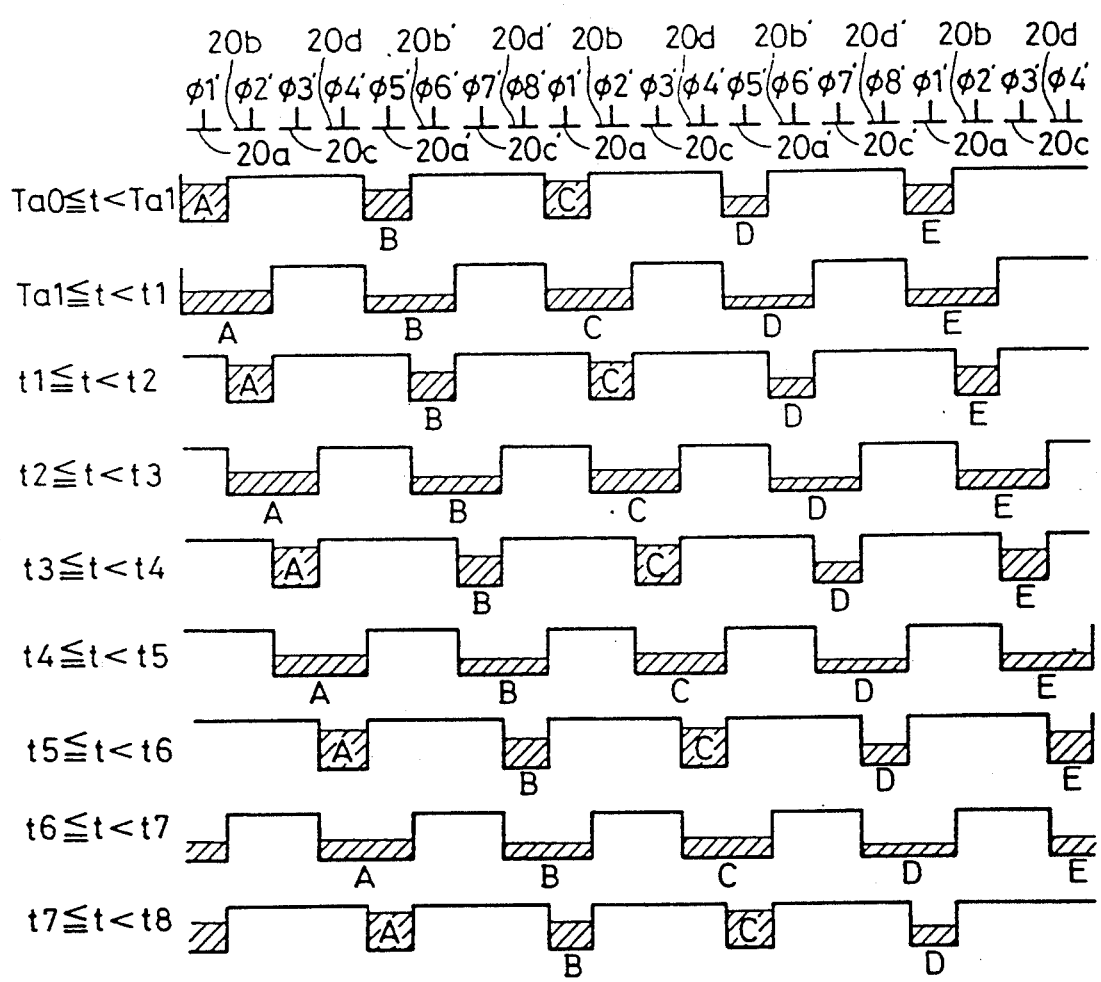
FIG. 13 is a diagram illustrating potential profiles in a charge transfer direction during the charge transfer operation of the eight-phase driving CCD.
Figure 14:
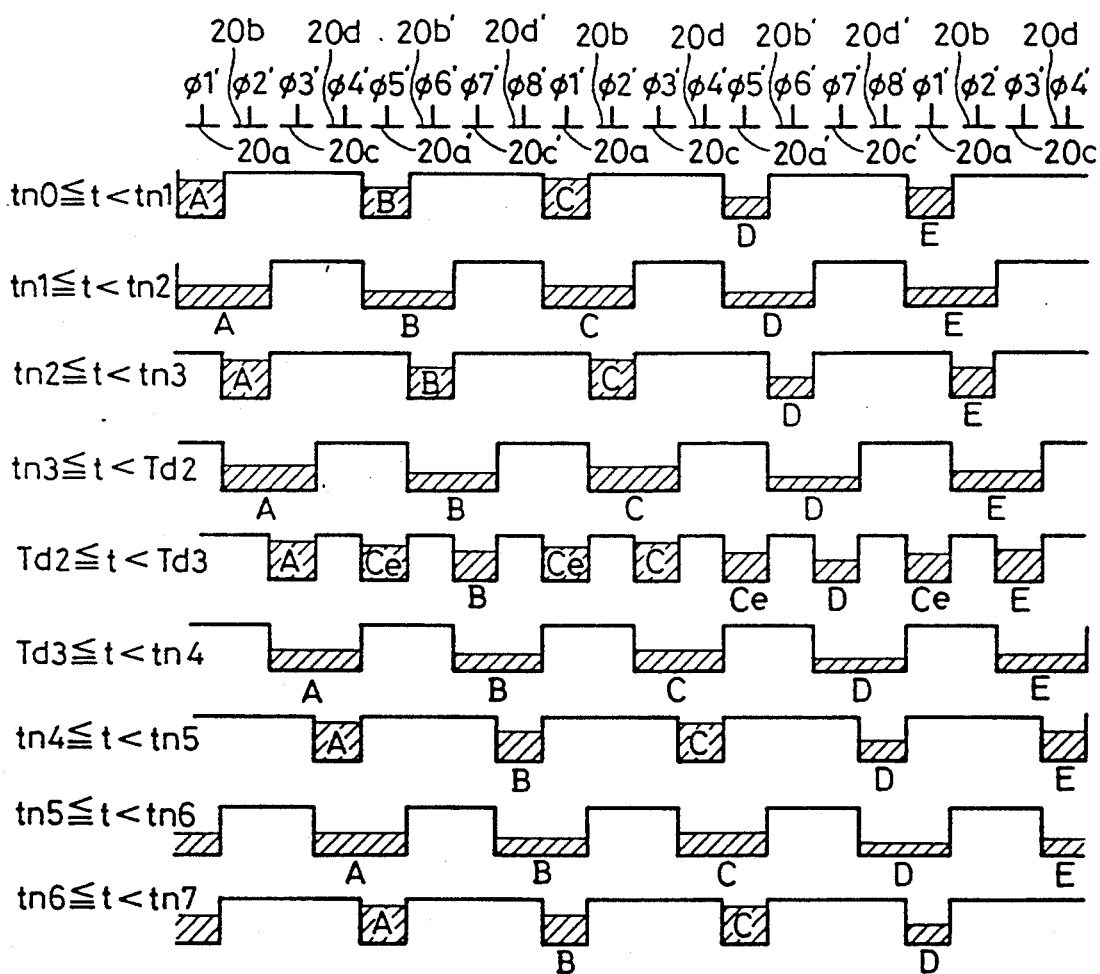
FIG. 14 is a diagram illustrating potential profiles for explaining stored charge drain operation during the charge transfer operation of the eight-phase driving CCD.
Figure 15A:
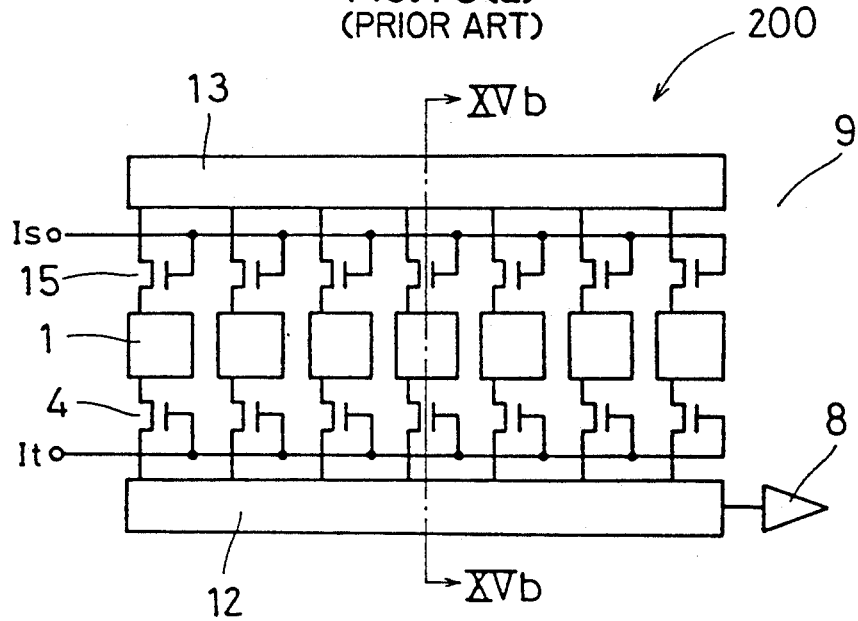
Figure 15B:
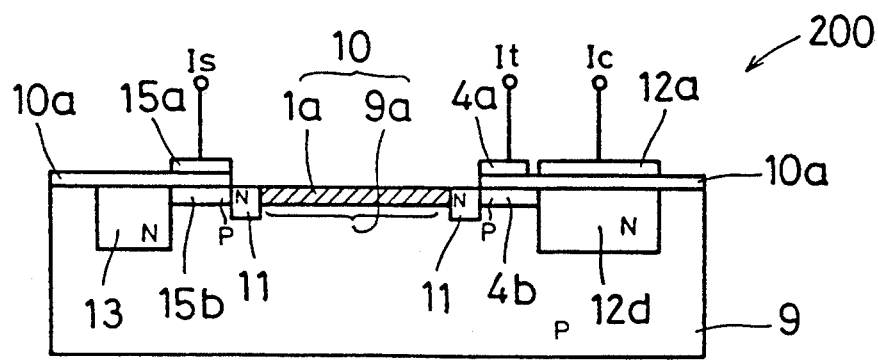
Figure 16:
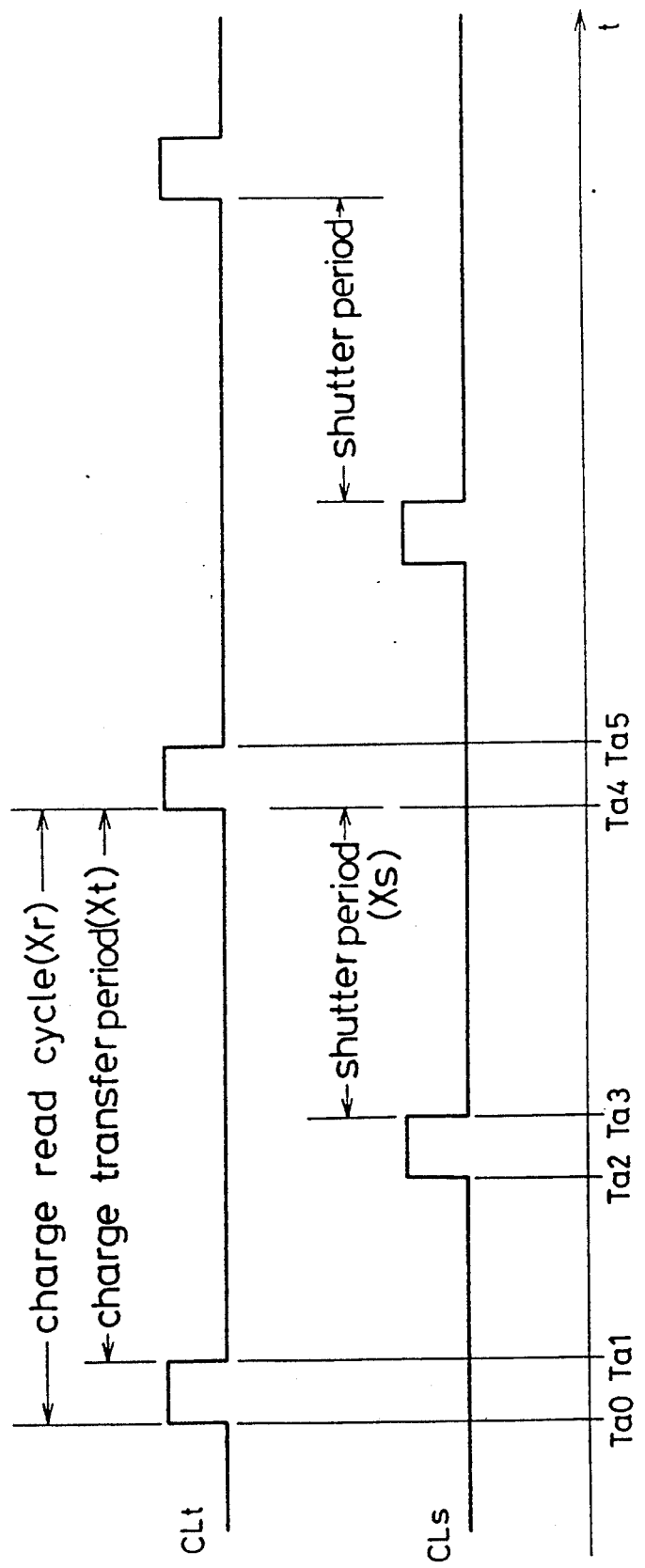
FIG. 16 is a diagram illustrating the relation between the charge read cycle and the shutter period of the prior art infrared linear image sensor.
Figure 18:
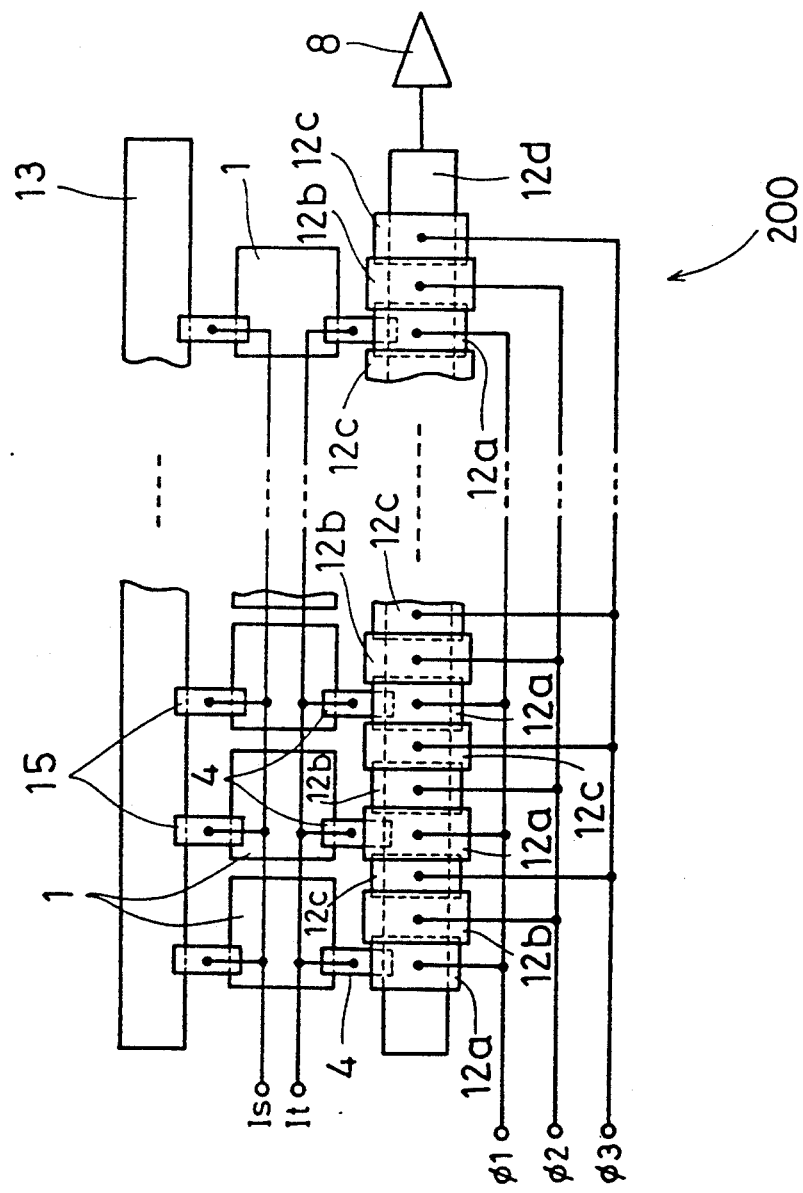
FIG. 18 is a plan view illustrating a layout of gate electrodes of respective elements in the prior art infrared linear image sensor.
Figure 19:
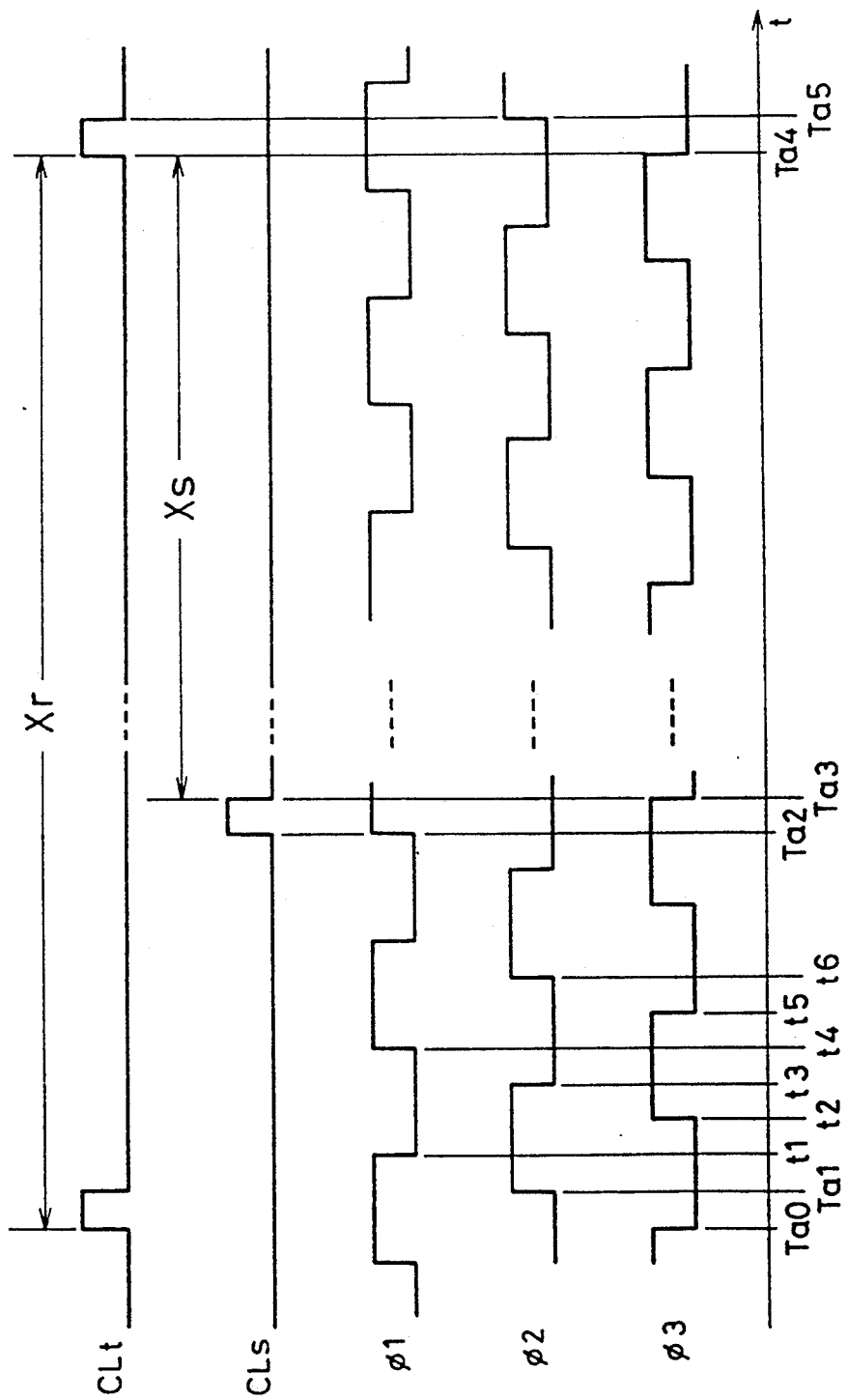
FIG. 19 is a diagram illustrating waveforms of signals for the charge transfer operation of the prior art infrared linear image sensor.
Figure 20:
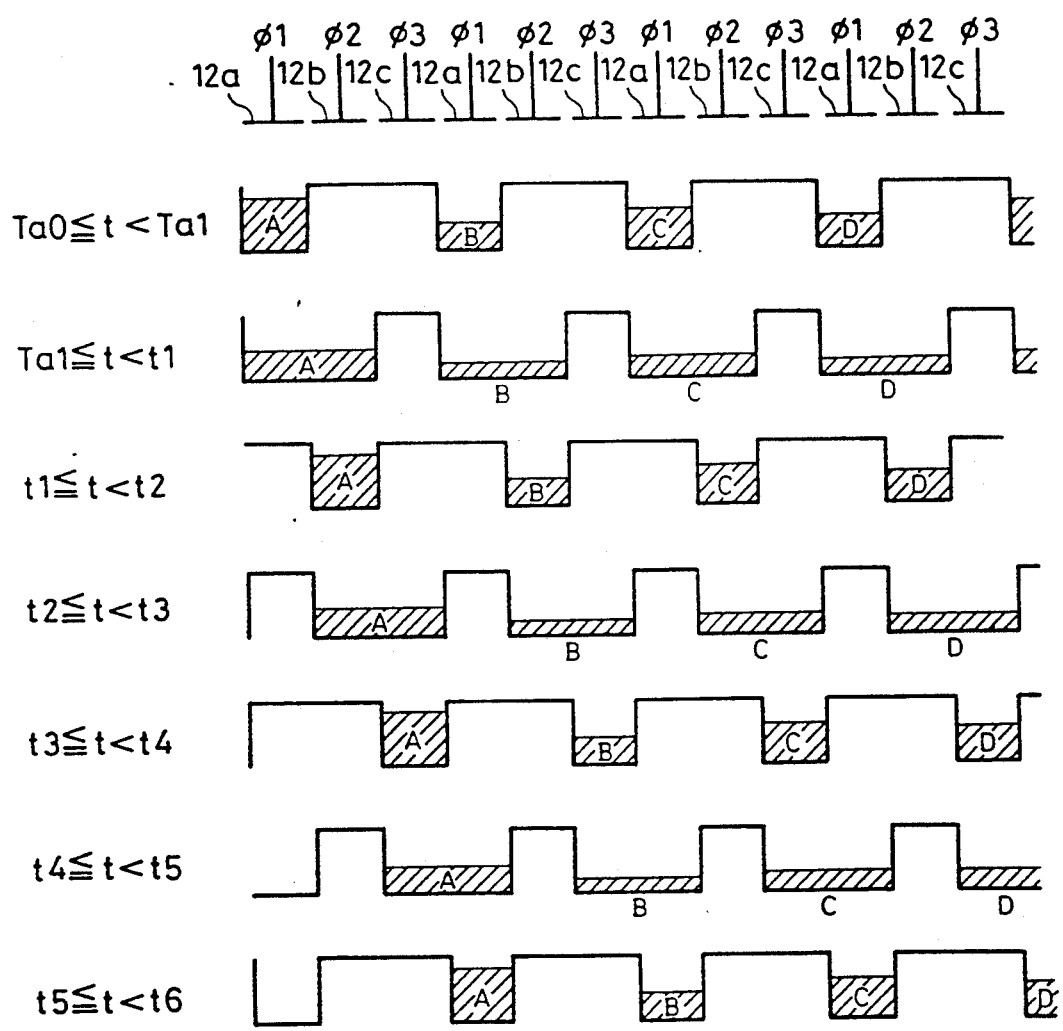
FIG. 20 is a diagram illustrating potential profiles in the CCD during the charge transfer operation.
Figure 23A:
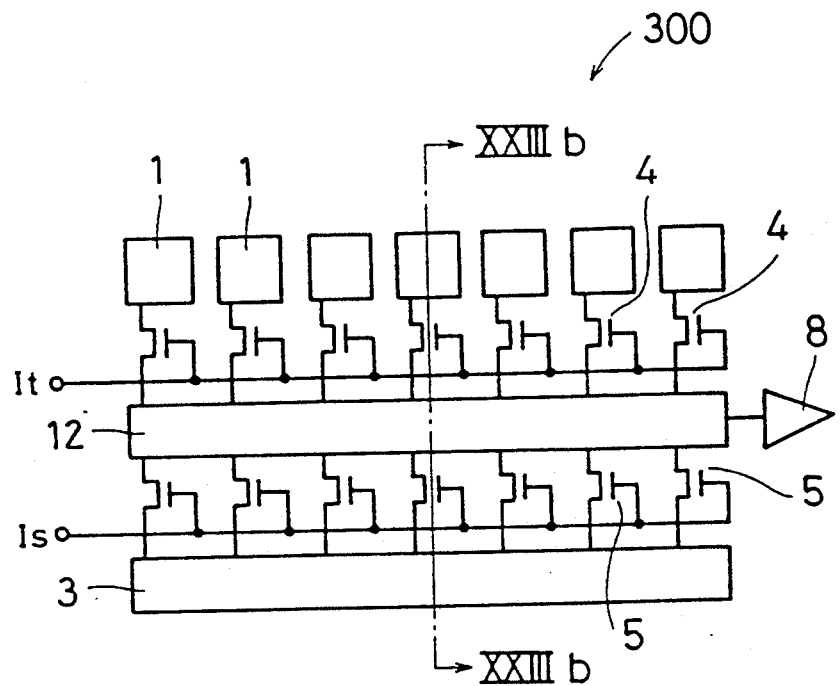
Figure 23B:
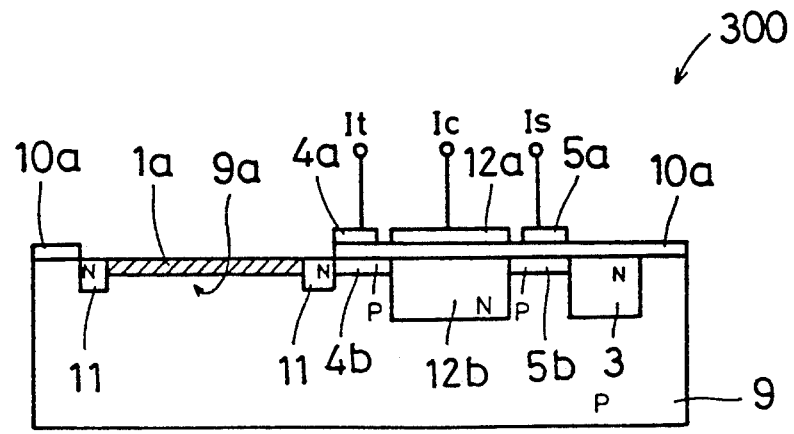

FIGS. 11, 12, 13, and 14 are diagrams for explaining the linear image sensor according to the third embodiment of the present invention, which correspond to FIGS. 6, 7, 9, and 10 of the second embodiment, respectively. FIG. 11 is a plan view illustrating a layout of each element of the infrared linear image sensor. FIG. 12 illustrates clock signals applied to the respective gates of the linear image sensor of FIG. 11 during the charge read operation. FIG. 13 illustrates a manner of transferring signal charges in the CCD. FIG. 14 illustrates timing for draining signal charges during the charge transfer operation. In addition, potential profiles in a cross section taken along a line X—X of FIG. 11 during the charge read operation are identical to the potential profiles shown in FIGS. 8(a)-8(g).

In this third embodiment, the eight-phase driving clocks $\phi 1'$ to $\phi 8'$ are used as driving clocks for the charge transfer element, and the first to fourth driving clocks $\phi 1'$ to $\phi 4'$ are applied to the transfer gates 20a to 20d of the odd numbered infrared detectors 1 of the infrared detectors arranged in a one-dimensional array while the fifth to eighth driving clocks $\phi 5'$ to $\phi 8'$ are applied to the even numbered transfer gates 20a' to 20d' of the infrared detectors 1'. Other structures are the same as those in the second embodiment of the present invention.

Each of the first to eighth CCD driving clocks $\phi 1'$ to $\phi 8'$ has a half cycle of CCD driving pulse as compared with the CCD driving clock according to the second embodiment. In addition, the phases of the CCD driving pulses are successively delayed by 45 degrees from each other. In other words, clocks obtained by overlapping the clocks $\phi 1'$ and $\phi 5'$, $\phi 2'$ and $\phi 6'$, $\phi 3'$ and $\phi 7'$, and $\phi 4'$ and $\phi 8'$ are equivalent to the driving clocks $\phi 1$, $\phi 2$, $\phi 3$, and $\phi 4$ used in the second embodiment, respectively. However, the first driving clock $\phi 1'$ and the fifth driving clock $\phi 5'$ generate pulses for draining the charges stored in the infrared detectors 1 at the same time (t=Td2) during which the shutter gate control clock CLs is generated (FIG. 12).

According to the third embodiment of the present invention, the ordinary charge transfer operation of the CCD 20 is carried out as shown in FIG. 13 while the shutter operation during the charge transfer operation is carried out as shown in FIG. 14, in the same manner as the linear image sensor of the second embodiment, so that the same effects as described with respect to the second embodiment are achieved.

As is evident from the foregoing description, according to the present invention, a CCD having a charge transfer part disposed between a one-dimensional array of photodetectors and an overflow drain includes four or more transfer gates for each photodetector, and four or more phase driving clocks are applied to the respective transfer gates. Therefore, during the charge transfer operation, there is a state where three adjacent transfer gates are all closed, so that signal charges are drained from the photodetector into the overflow drain through the transfer gate in the middle of the three transfer gates without mixing the drained signal charges with signal charges transferred by the CCD. That is, the charge drain operation is carried out during the charge transfer operation in the charge transfer part, whereby the timing of opening the shutter gate can be set at an arbitrary time in the charge read cycle.

In addition, according to the present invention, the above-described CCD includes five transfer gates for each photodetector and the five transfer gates are controlled by five-phase driving clocks for charge transfer. Therefore, even when three adjacent transfer gates among the five transfer gates are used for the draining charge during a charge transfer operation, the remaining two transfer gates are used for the charge transfer operation, so that signal charges from the photodetector are received by a potential well equivalent to two transfer gates and the amount of transferred signal charges is doubled.

In addition, according to the present invention, the above-described CCD includes four transfer gates for each photodetector and these transfer gates are controlled by four-phase driving clocks for charge transfer. Therefore, as compared with the five-phase driving CCD, a transfer gate and a driving clock therefor are dispensed with, whereby the structure of the CCD is simplified.

What is claimed is:

1. A linear sensor comprising:
    a semiconductor substrate;
    a one-dimensional array of photodetectors for producing signal charges in response to incident light;
    a charge transfer part for transferring signal charges stored in said photodetector array, said charge transfer part being disposed on one side of and parallel to said photodetector array;
    a charge drain part for draining signal charges through said charge transfer part, said charge drain part being disposed on an opposite side of said charge transfer part from said photodetector array;
    said charge transfer part including:
        a charge coupled device (CCD) having at least four CCD transfer gates for each photodetector for transferring signal charges from each photodetector in a direction along said photodetector array;
    photodetector transfer gates for controlling charge transfer from said photodetector array to said CCD, each photodetector transfer gate being disposed between one of said photodetectors and one of said CCD transfer gates corresponding to said photodetector;
    shutter gates for controlling charge transfer from a respective CCD transfer gate of said CCD transfer gates for each photodetector to said charge drain part, each shutter gate being disposed between and respectively connected to one of said transfer gates for each photodetector and said charge drain part; and
    at least four phase driving clocks for controlling said CCD transfer gates and said shutter gates, said driving clocks turning off the two CCD transfer gates adjacent a CCD transfer gate connected to a shutter gate when said shutter gate and said CCD transfer gate connected to said shutter gate are turned on to transfer signal charges to said charge drain part.

2. The linear image sensor of claim 1 wherein said CCD includes five CCD transfer gates for each photodetector and five-phase driving clocks for controlling said CCD transfer gates.

3. The linear image sensor of claim 1 wherein said photodetectors are Schottky barrier diodes for detecting infrared light, each diode comprising a platinum silicide layer disposed on a p type silicon substrate.

4. The linear image sensor of claim 3 wherein said charge drain part is disposed parallel to said photodetector array on said p type silicon substrate and comprises an n type region in said substrate in which charge drain wells deeper than charge storage wells of said photodetectors and charge transfer wells of said CCD are formed when a positive voltage is applied.

5. The linear image sensor of claim 1 wherein said CCD consist of four CCD transfer gates for each photodetector and four-phase driving clocks for controlling said CCD transfer gates.

6. The linear image sensor of claim 1 including fewer CCD transfer gates for each photodetector than phase driving clocks for said CCD transfer gates.

* * * * *